United States Patent
Machida et al.

(10) Patent No.: US 7,435,668 B2
(45) Date of Patent: Oct. 14, 2008

(54) METHOD FOR DOPING IMPURITIES, AND FOR PRODUCING A SEMICONDUCTOR DEVICE AND APPLIED ELECTRONIC APPARATUS USING A SOLUTION CONTAINING IMPURITY IONS

(75) Inventors: Akio Machida, Kanagawa (JP); Takahiro Kamei, Kanagawa (JP); Yoshiyuki Kawana, Kanagawa (JP)

(73) Assignee: Sony Corporation, Tokyo (JP)

( * ) Notice: Subject to any disclaimer, the term of this patent is extended or adjusted under 35 U.S.C. 154(b) by 343 days.

(21) Appl. No.: 11/039,996

(22) Filed: Jan. 24, 2005

(65) Prior Publication Data
US 2005/0181566 A1   Aug. 18, 2005

(30) Foreign Application Priority Data
Feb. 12, 2004 (JP) ............... 2004-034608
Mar. 12, 2004 (JP) ............... 2004-070493

(51) Int. Cl.
*H01L 21/225* (2006.01)

(52) U.S. Cl. ............... 438/487; 438/558; 438/562; 257/E21.148

(58) Field of Classification Search ............... 438/562; 257/E21.148
See application file for complete search history.

(56) References Cited

U.S. PATENT DOCUMENTS

| | | | | |
|---|---|---|---|---|
| 3,420,719 | A * | 1/1969 | Potts et al. | 438/5 |
| 4,571,366 | A * | 2/1986 | Thomas et al. | 428/446 |
| 5,478,776 | A * | 12/1995 | Luftman et al. | 438/301 |
| 5,712,199 | A * | 1/1998 | Nakagawa et al. | 438/62 |
| 6,489,225 | B1 * | 12/2002 | Ross et al. | 438/535 |
| 2004/0029364 | A1 * | 2/2004 | Aoki et al. | 438/478 |
| 2005/0056828 | A1 * | 3/2005 | Wada et al. | 257/40 |

* cited by examiner

*Primary Examiner*—Stephen W Smoot
(74) *Attorney, Agent, or Firm*—Oblon, Spivak, McClelland, Maier & Neustadt, P.C.

(57) ABSTRACT

A solution containing impurity ions is applied onto the surface of a silicon film to form a solution layer, followed by drying into a compound layer containing the impurities. Heat treatment is performed by irradiation with an energy beam so as to diffuse the impurity atoms in the compound layer toward the silicon film into a source region and a drain region. Subsequently, the compound layer is removed.

17 Claims, 14 Drawing Sheets

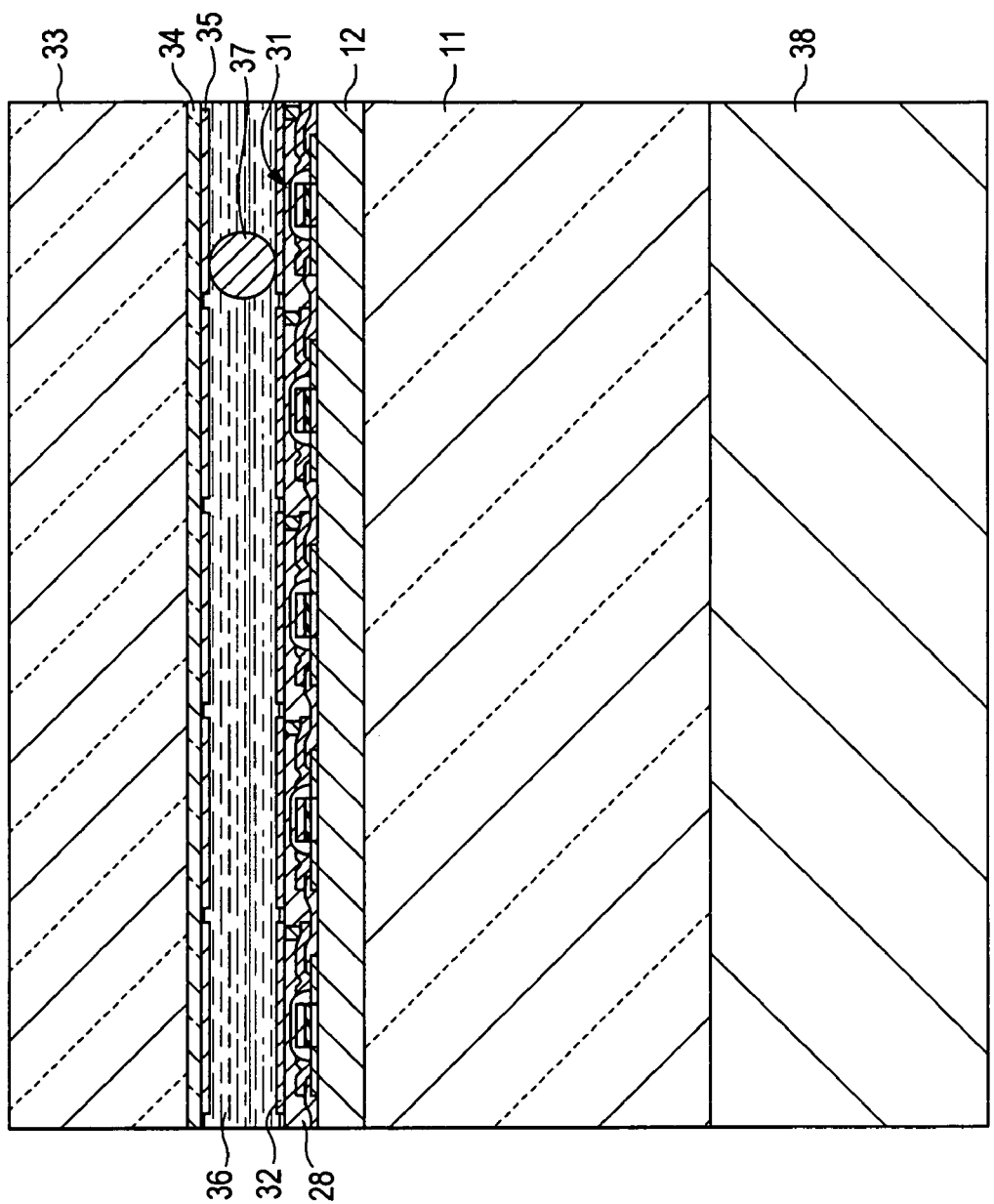

METHOD FOR DOPING IMPURITIES, AND FOR PRODUCING A SEMICONDUCTOR DEVICE AND APPLIED ELECTRONIC APPARATUS USING A SOLUTION CONTAINING IMPURITY IONS

BACKGROUND OF THE INVENTION

1. Field of the Invention

The present invention relates to a method for doping impurities, methods for producing a semiconductor device and an applied electronic apparatus. For example, the present invention is suitably applied to the production of a thin-film semiconductor element.

2. Description of the Related Art

Input/output devices become dramatically important with the progress of an advanced information age, and such devices are required to have greater functionality. Furthermore, in accordance with the remarkable widespread use of mobile devices in recent years, the development of a technique for forming a thin-film transistor (TFT) on a plastic substrate has been desired, the plastic substrate having advantages in that it is light, flexible, and nonfragile, compared with a general glass substrate. In such circumstances, the research and development of, for example, an active-matrix liquid crystal display (AMLCD) and a contact image sensor (CIS), each containing such TFTs, has been extensively conducted.

TFTs, each having a channel formed of a semiconductor film composed of silicon, are classified into two types based on a material constituting a layer through which carriers move (active layer): one type has a semiconductor film composed of amorphous silicon (a-Si); and another type has a semiconductor film composed of polycrystalline silicon (not monocrystalline but crystalline silicon) containing crystal phases. Polysilicon (poly-Si) and microcrystalline silicon (c-Si) are mainly known as the polycrystalline silicon.

Semiconductors composed of polycrystalline silicon, such as polysilicon and microcrystalline silicon, have advantages in that carrier mobility of such semiconductors is about 10 to 100 times as high as that of semiconductors composed of amorphous silicon, and thus have excellent properties as materials for switching elements. Furthermore, TFTs, each having an active layer composed of polycrystalline silicon, can operate at high speed and thus have been receiving attention recently as switching elements constituting, for example, various logic circuits such as domino logic circuits and CMOS transmission gate circuits; multiplexers, erasable programmable read-only memories (EPROMs), electrically erasable programmable read-only memories (EEPROMs), charge-coupled devices (CCDs), and random-access memories (RAMs), which contain those logic circuits; and driving circuits used for liquid crystal displays, electroluminescence displays and the like. In recent years, active-matrix liquid crystal displays employing TFTs as switching elements and as elements constituting peripheral driving circuits have been receiving attention, the TFTs each having a channel layer formed of a semiconductor film composed of such polycrystalline silicon. By constituting a TFT array composed of polycrystalline silicon semiconductor films, which can be formed at low temperature, on an inexpensive amorphous glass substrate, it is possible to produce a reflective panel display, such as a flat-screen television set, having a large area, a high definition, high quality, and a low cost.

In processes for producing polysilicon TFTs, the maximum temperature reaches about 1,000° C. Thus, insulating substrates used for the production of the polysilicon TFTs are composed of silica glass that has excellent heat resistance. That is, glass substrates that have relatively low melting points are hardly used for such processes. However, in order to achieve lower production costs for the liquid crystal displays, it is necessary to use glass substrates having low melting points. In recent years, the development of a low-temperature process in which the maximum temperature is 600° C. or less has proceeded and a device has actually been produced. Furthermore, the use of plastic substrates that can easily achieve larger area at lower temperatures has been studied. The deformation temperature of the plastic substrate is 200° C. at the highest even when the plastic substrate is composed of a heat-resistant material. Accordingly, when the plastic substrate is used, all processes must be performed at 200° C. or less, that is, at ultra-low temperatures compared with the case of a known art.

A trend toward large-area liquid crystal display requires a large-area semiconductor film. In low-temperature process for producing a polysilicon TFT, ion doping or plasma doping can be employed for injecting impurities into such a large-area semiconductor film with high throughput. The ion doping is performed as follows: An impurity gas is ionized and accelerated in an electric field without mass separation. Then a semiconductor film having a large area is irradiated with the accelerated impurity ions in a single operation. The plasma doping is performed as follows: An impurity gas and a gas for forming a film are simultaneously ionized, and then a film containing the impurity ions is formed the on a surface of a substrate. On the other hand, ion implantation is performed as follows: Impurity ions are subjected to mass separation, and an ion beam is produced. Then, a semiconductor film is irradiated with the ion beam. This ion implantation has the following disadvantages: The temperature of a substrate is increased because of the energy of the implanted ions; thus, the ion implantation cannot be applicable to a plastic substrate having a low melting point. In view of employing a beam scan and the size of apparatus, the ion implantation is not suitable for a large-area process. As described above, the ion doping and plasma doping have the advantages in their suitability for a trend toward large-area substrates. However, a semiconductor film subjected to ion doping or plasma doping contains a large amount of hydrogen. For example, when a plastic substrate is used, lower-temperature processes are required. However, the plastic substrate cannot be heated to a temperature required for removing hydrogen (400° C. to 460° C.). As a result, subsequent excimer laser annealing (ELA) for crystallization causes hydrogen in the film to blow out, thus damaging the semiconductor film. Furthermore, there is a problem in which the ion doping and plasma doping are not suitable for self-aligned processes in principle.

Laser-induced melting of predeposited impurity doping (LIMPID), which is disclosed in Japanese Unexamined Patent Application Publication Nos. 61-138131, 62-2531, 62-264619, and 9-293878, has recently been receiving attention as a process in which doping can be performed at ultra-low temperatures, i.e., 200° C. or less. The LIMPID is performed as follows: An impurity gas is ionized, and the resulting impurity ions are adsorbed on the surface of a semiconductor film. Then, the semiconductor film is melted by excimer laser irradiation, and thus the impurities move into the film. The film subjected to the LIMPID does not contain hydrogen. The LIMPID is suitable for not only a self-aligned process but also a low-temperature process. Consequently, the LIMPID has been receiving attention.

On the other hand, in recent years, the needs of the market for thin, light, large-sized, flat-screen television sets have been rapidly expanding instead of known television sets using a cathode-ray tube. In order to produce inexpensive large-sized flat-screen liquid crystal displays, efforts have been under way to improve throughput of their production lines. For example, a process for producing several display panels at a time from one substrate, the so-called "mother glass" has been developed.

As described above, the LIMPID using excimer laser is suitable for not only a self-aligned process but also a low-temperature process; therefore, the LIMPID has been receiving attention.

However, the LIMPID needs to use toxic impurity gases such as phosphine ($PH_3$) and diborane ($B_2H_6$). Therefore, it is necessary to place a substrate in an evacuated chamber and then to perform plasma decomposition of the impurity gas, and to use a different chamber for each impurity gas in order to prevent cross-contamination. In addition, there are problems with contamination in the chambers and lines. Furthermore, the excessively introduced impurity gases during adsorption treatment increase the loads on the human body and the environment.

The trends toward large-sized flat-screen displays require glass substrates, called "mother glass", each having a length of 1 m or more. The productions of such displays by known vacuum processes require larger vacuum chambers, larger transfer robots, larger production lines, and thus larger clean rooms. Those sizes reach a maximum. As a result, a capital investment entails a lot of costs.

SUMMARY OF THE INVENTION

Accordingly, it is an object of the present invention to provide a method for doping impurities, methods for producing a semiconductor device and an applied electronic apparatus employing the process. The method for doping impurities has the following advantages: no need to use toxic impurity gases and an extensive amount of equipment; lower levels of contamination in apparatuses and lines used; lower amounts of dopants used; lower loads on the human body and the environment; and suitability for low-melting-point substrates, such as plastic substrates, and for large area substrates.

It is another object of the present invention to provide a process for producing a semiconductor device at ambient pressure, the process suppressing a capital investment to produce a semiconductor device at low cost. It is yet another object of the present invention to provide a method for manufacturing an applied electronic apparatus employing the process.

To solve the above-described problems, in a first aspect of the present invention, a method for doping impurities includes the steps of applying a solution containing impurity ions onto at least part of a surface of a base drying the solution to form a compound layer containing the impurities; diffusing the impurity atoms in the compound layer toward the base by heat treatment; and removing the compound layer.

The solution containing the impurity ions (dopant ions) is typically applied onto a surface of a base by coating, dispersing (spraying), or printing. The impurity ion content in the solution is determined according to the amount of impurity ions to be absorbed on the surface of the base. A solution having a desired impurity ion content can be easily prepared. Various methods for printing, for example, imprinting, screen printing, gravure printing, and offset printing in addition to contact printing can be used. The base is typically composed of semiconductor. The base may also be composed of an insulator or a dielectric (including a ferroelectric), the insulator and dielectric typically being oxides; superconductor; or a nonlinear optical material. An example of the nonlinear optical material includes lithium niobate ($LiNbO_3$). If the base is composed of $LiNbO_3$, titanium (Ti) is diffused into the base. If the base is composed of semiconductor, the base is principally composed of an element in group IV of the periodic table, such as silicon and germanium, and the base containing impurity ions of an element in group V or group III of the periodic table. For example, when the ions of an element in group V are phosphorus (P) ions, the compound layer is composed of a phosphorus compound. When the ions of an element in group III are boron (B) ions, the compound layer is composed of a boron compound.

The heat treatment for diffusing impurity atoms may be typically performed with an energy source. A surface region of the base into which the impurity ions are diffused may be selectively irradiated with radiation from the energy source. A larger area including the region or the entire surface of the base may be irradiated with radiation from the energy source. Examples of the radiation emitted from the energy source include pulsed or continuous-wave laser beam emitted from a laser light source, for example, an excimer laser, a YAG laser, a fiber laser, a ruby laser, or an argon (Ar) laser; infrared rays emitted from, for example, an infrared lamp or carbon heater; and ultraviolet rays emitted from an ultraviolet lamp.

The base may be in the form of a film, and may typically be a crystalline or an amorphous substrate including a film. If the base is composed of semiconductor, the base is, for example, an amorphous substrate having a semiconductor film. The semiconductor film may be composed of, for example, a deposited polysilane compound, a deposited polycondensate of a polysilane compound, amorphous silicon, microcrystalline silicon, polycrystalline silicon, or monocrystalline silicon; or a compound semiconductor, for example, a group III-V semiconductor, such as gallium arsenide (GaAs), or gallium nitride (GaN), or a group II-VI semiconductor such as zinc selenide (ZnSe). An inexpensive material capable of easily forming a large-sized substrate but having low heat resistance (low melting point), for example, glass or an organic polymeric material (plastic), is suitably used as the amorphous substrate.

If the base or the semiconductor base is flexible, for example, a plastic substrate including a semiconductor film is used as the semiconductor base, in the method for doping impurities, at least one of the steps or all the steps may be performed by a roll-to-roll process. For example, in this roll-to-roll process, a tape substrate composed of, for example, a transparent plastic film, wound on a first roller is subjected to predetermined processing and then is wound on a second roller for winding up. Consequently, a step can be efficiently performed in a short time by the roll-to-roll process.

In a second aspect of the present invention, a method for producing a semiconductor device includes the steps of applying a solution containing impurity ions onto at least part of a surface of a semiconductor base drying the solution to form a compound layer containing the impurities; diffusing the impurity atoms in the compound layer toward the semiconductor base by heating treatment; and removing the compound layer.

Various semiconductor devices may be produced. A typical example of the semiconductor device is a thin-film semiconductor device such as a thin-film transistor (TFT). The production of such a thin-film transistor includes the steps of forming a gate insulating film and forming a gate electrode. The gate insulating film may be formed by various film-forming techniques and may be composed of various materials. The use of a silanol compound or a polycondensate of a silanol compound, which are insulating materials that can be applied by coating, can easily form the gate insulating film.

The gate electrode may also be formed by various film-forming techniques and may be composed of various materials. The gate electrode can easily be formed by plating or by applying a solution containing metal particles to form a film and then sintering the resulting film.

The description regarding the first aspect of the present invention is applicable to the second aspect of the present invention as long as the description does not violate the nature of the second aspect.

In a third aspect of the present invention, a method for producing a semiconductor device includes the steps of forming an amorphous silicon film on a substrate; irradiating the amorphous silicon film with an energy source to modify the amorphous silicon film into a crystalline silicon film; forming a gate insulating film on the crystalline silicon film; forming a gate electrode on the gate insulating film; applying a solution containing impurity ions onto the crystalline silicon film at both sides of the gate electrode; drying the solution to form a compound layer containing the impurities; diffusing the impurity atoms in the compound layer toward the crystalline silicon film by heating treatment through the gate electrode functioning as a mask, to form a source region and a drain region; and removing the compound layer.

The description regarding the first and second aspects of the present invention is applicable to the third aspect of the present invention as long as the description does not violate the nature of the third aspect.

In a fourth aspect of the present invention, a method for producing an applied electronic apparatus includes the steps of allowing a solution containing impurity ions onto at least part of a surface of a semiconductor base; drying the solution to form a compound layer containing the impurities; diffusing the impurity atoms in the compound layer toward the semiconductor base by heating treatment; and removing the compound layer.

In a fifth aspect of the present invention, a method for producing an applied electronic apparatus includes the steps of forming an amorphous silicon film on a substrate; irradiating the amorphous silicon film with an energy source to modify the amorphous silicon film into a crystalline silicon film; forming a gate insulating film on the crystalline silicon film; forming a gate electrode on the gate insulating film; applying a solution containing impurity ions onto the crystalline silicon film at both sides of the gate electrode; drying the solution to form a compound layer containing the impurities; diffusing the impurity atoms in the compound layer toward the crystalline silicon film by heating treatment through the gate electrode functioning as a mask, to form a source region and a drain region; and removing the compound layer.

In the fourth and fifth aspects of the present invention, examples of the applied electronic apparatus include a liquid crystal display and any other image display. The semiconductor base corresponds to, for example, a back panel of such a display.

The description regarding the first and second aspects of the present invention is applicable to the fourth and fifth aspects of the present invention as long as the description does not violate the nature of the fourth and fifth aspects.

In a sixth aspect of the present invention, a method for producing a semiconductor device includes the steps of heat-treating a polysilane compound provided on an amorphous substrate to form a silicon film; and forming an oxide film on the surface of the silicon film by ozone oxidation or remote plasma oxidation.

In a seventh aspect of the present invention, a method for producing a semiconductor device includes the steps of heat-treating a polysilane compound provided on an amorphous substrate to form a silicon film; applying a coating solution for forming an oxide film onto the surface of the silicon film; and forming an oxide film by heating treatment.

In an eighth aspect of the present invention, a method for producing a semiconductor device includes the steps of heat-treating a polysilane compound provided on an amorphous substrate to form a silicon film; forming a first oxide film on the silicon film by ozone oxidation or remote plasma oxidation; applying a coating solution for forming an oxide film onto the surface of the first oxide film; and forming a second oxide film by heating treatment.

In a ninth aspect of the present invention, a method for producing a semiconductor device includes the steps of heat-treating a polysilane compound provided on an amorphous substrate to form a silicon film; applying a coating solution for forming an oxide film onto the surface of the silicon film; and densifying the oxide film by ozone oxidation or remote plasma oxidation.

In a tenth aspect of the present invention, a method for producing a semiconductor device includes the steps of heat-treating a polysilane compound provided on an amorphous substrate to form a silicon film; and forming an oxide film on the surface of the silicon film by atmospheric pressure chemical vapor deposition (atmospheric pressure CVD).

In an eleventh aspect of the present invention, a method for producing a semiconductor device includes the steps of heat-treating a polysilane compound provided on an amorphous substrate to form a silicon film; forming an oxide film on the surface of the silicon film by ozone oxidation or remote plasma oxidation; forming a metal film having a predetermined shape on the oxide film by plating; removing the oxide film through the metal film functioning as a mask; applying a solution containing impurity ions onto the silicon film through the metal film functioning as a mask; drying the solution to form a compound layer containing the impurities; and diffusing the impurity atoms in the compound layer toward the silicon film through the metal film functioning as a mask by heating treatment with an energy source.

In a twelfth aspect of the present invention, a method for producing a semiconductor device includes the steps of heat-treating a polysilane compound provided on an amorphous substrate to form a silicon film; applying a coating solution for forming an oxide film onto the surface of the silicon film; forming an oxide film by heating treatment; forming a metal film having a predetermined shape on the oxide film by plating; removing the oxide film through the metal film functioning as a mask; applying a solution containing impurity ions onto the silicon film through the metal film functioning as a mask; drying the solution to form a compound layer containing the impurities; and diffusing the impurity atoms in the compound layer toward the silicon film through the metal film functioning as a mask by heating treatment with an energy source.

In a thirteenth aspect of the present invention, a method for producing a semiconductor device includes the steps of heat-treating a polysilane compound provided on an amorphous substrate to form a silicon film; forming a first oxide film on the silicon film by ozone oxidation or remote plasma oxidation; applying a coating solution for forming an oxide film onto the surface of the first oxide film; forming a second oxide film by heating treatment; forming a metal film having a predetermined shape on the second oxide film by plating; removing the first oxide film and the second oxide film through the metal film functioning as a mask; applying a solution containing impurity ions onto the silicon film through the metal film functioning as a mask; drying the adhering solution to form a compound layer containing the impurities; and diffusing the impurity atoms in the compound layer toward the silicon film through the metal film functioning as a mask by heating treatment with an energy source.

In a fourteenth aspect of the present invention, a method for producing a semiconductor device includes the steps of heat-treating a polysilane compound provided on an amorphous substrate to form a silicon film; applying a coating solution for forming an oxide film onto the surface of the silicon film; forming an oxide film by heating treatment; densifying the oxide film by ozone oxidation or remote plasma oxidation; forming a metal film having a predetermined shape on the oxide film; removing the oxide film through the metal film functioning as a mask; applying a solution containing impurity ions onto the silicon film through the metal film functioning as a mask; drying the solution to form a compound layer containing the impurities; and diffusing the impurity atoms in the compound layer toward the silicon film through the metal film functioning as a mask by heating treatment with an energy source.

In a fifteenth aspect of the present invention, a method for producing a semiconductor device includes the steps of heat-treating a polysilane compound provided on an amorphous substrate to form a silicon film; forming an oxide film on the silicon film by ozone oxidation or remote plasma oxidation; applying a solution containing fine metal particles onto the oxide film; drying the solution to form a metal particle layer composed of the fine metal particles; forming a metal film having a predetermined shape on the metal particle layer by plating; removing the oxide film through the metal film functioning as a mask; applying a solution containing impurity ions onto the silicon film through the metal film functioning as a mask; drying the solution to form a compound layer containing the impurities; and diffusing the impurity atoms in the compound layer toward the silicon film through the metal film functioning as a mask by heating treatment with an energy source.

In a sixteenth aspect of the present invention, a method for producing a semiconductor device includes the steps of heat-treating a polysilane compound provided on an amorphous substrate to form a silicon film; applying a coating solution for forming an oxide film onto the surface of the silicon film; forming an oxide film by heating treatment; applying a solution containing fine metal particles onto the oxide film; drying the solution to form a metal particle layer composed of the fine metal particles; forming a metal film having a predetermined shape on the metal particle layer by plating; removing the oxide film through the metal film functioning as a mask; applying a solution containing impurity ions onto the silicon film through the metal film functioning as a mask; drying the solution to form a compound layer containing the impurities; and diffusing the impurity atoms in the compound layer toward the silicon film through the metal film functioning as a mask by heating treatment with an energy source.

In a seventeenth aspect of the present invention, a method for producing a semiconductor device includes the steps of heat-treating a polysilane compound provided on an amorphous substrate to form a silicon film; forming a first oxide film on the surface of the silicon film by ozone oxidation or remote plasma oxidation; applying a coating solution for forming an oxide film onto the surface of the first oxide film by coating, spraying, or printing; forming a second oxide film by heating treatment; applying a solution containing fine metal particles onto the second oxide film; drying the solution to form a metal particle layer composed of the fine metal particles; forming a metal film having a predetermined shape on the metal particle layer by plating; removing the first oxide film and the second oxide film through the metal film functioning as a mask; applying a solution containing impurity ions onto the silicon film through the metal film functioning as a mask; drying the solution to form a compound layer containing the impurities; and diffusing the impurity atoms in the compound layer toward the silicon film through the metal film functioning as a mask by heating treatment with an energy source.

In an eighteenth aspect of the present invention, a method for producing a semiconductor device includes the steps of heat-treating a polysilane compound provided on an amorphous substrate to form a silicon film; applying a coating solution for forming an oxide film onto the surface of the silicon film by coating, spraying, or printing; forming an oxide film by heating treatment; densifying the oxide film by ozone oxidation or remote plasma oxidation; applying a solution containing fine metal particles onto the oxide film; drying the solution to form a metal particle layer composed of the fine metal particles; forming a metal layer having a predetermined shape on the metal particle layer by plating; removing the oxide film through the metal film functioning as a mask; applying a solution containing impurity ions onto the silicon film through the metal film functioning as a mask; drying the solution to form a compound layer containing the impurities; and diffusing the impurity atoms in the compound layer toward the silicon film through the metal film functioning as a mask by heating treatment with an energy source.

In the sixth to eighteenth aspects of the present invention, the heat treatment with the energy beam may be performed by selective irradiation with a laser beam, for example, a semiconductor laser or a yttrium aluminum garnet laser (YAG laser). The ozone oxidation or the remote plasma oxidation may be performed at a pressure of $1 \times 10^{-2}$ Torr or higher or at an atmospheric pressure with a local evacuation is performed (including a low vacuum state generated with a simple evacuation system). Furthermore, all the steps are suitably performed at a pressure of $1 \times 10^{-2}$ Torr or higher or at an atmospheric pressure with a local evacuation. At least one of the steps is preferably performed by a roll-to-roll process. Most preferably, all the steps are performed by the roll-to-roll process.

The silicon film, the oxide film, the first oxide film, or the second oxide film may be subjected to patterning by wet etching. These films are suitably etched by atmospheric pressure plasma.

The description regarding the first to fifth aspects of the present invention is applicable to the sixth to eighteenth aspects of the present invention as long as the description does not violate the nature of the sixth to eighteenth aspects.

Furthermore, the steps in the sixth to eighteenth aspects of the present invention can be combined with the steps in the first to fifth aspects of the present invention as appropriate.

In the present invention described above, a large vacuum pumping system and a plasma generating apparatus are not needed, unlike the case of known LIMPID. By using a simple apparatus for applying a desired volume of a solution onto a substrate by, for example, coating, dispersing, or printing and a simple apparatus for drying the solution, for example, a hot plate, the impurity ions can be absorbed on the surface of the base before the heat treatment by, for example, irradiation of the energy beam. Thus, the amount of impurity ions used and the capital investment can be greatly reduced. The amount of impurity ions absorbed can be easily controlled by the concentration of the solution and the amount of the solution applied; hence, the amount of impurity atoms to be diffused toward the base or the semiconductor base, for example, the semiconductor film and then activated can be easily controlled. The heat treatment by the irradiation with an energy beam enables to use a substrate composed of, for example, a plastic or glass, each having a low-melting point.

The silicon film, the gate insulating film, the gate electrode, the source electrode, and the drain electrode can be formed at a low temperature and under atmospheric pressure, that is, without any vacuum apparatus. Thus, a semiconductor device can be produced by, for example, a roll-to-roll process with a flexible substrate composed of, for example, a plastic.

BRIEF DESCRIPTION OF THE DRAWINGS

FIG. 5 is a cross-sectional view illustrating a method for producing an active-matrix liquid crystal display according to Example 3 of the present invention;

DESCRIPTION OF THE PREFERRED EMBODIMENTS

Embodiments of the present invention will now be described with reference to the drawings.

FIGS. 1A to 1E each show a first embodiment of a method for producing a silicon TFT. In fact, many silicon TFTs are simultaneously formed on the same substrate, however, only one silicon TFT is shown below.

Figure 1A:
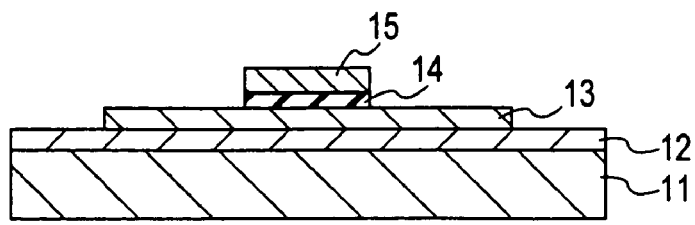
FIG. 1 is a cross-sectional view illustrating a method for producing a silicon TFT according to a first embodiment of the present invention.

As shown in FIG. 1A, in the first embodiment, a buffer layer 12, for example, silicon dioxide ($SiO_2$) or silicon nitride ($SiN_x$) is formed on a substrate 11 composed of, for example, glass or a plastic. Then, an island-shaped silicon film 13 composed of, for example, amorphous silicon or microcrystalline silicon, a gate insulating film 14 having a predetermined shape, and a gate electrode 15 having a predetermined shape, are formed.

The buffer layer 12 and the silicon film 13 may be formed by not only known film deposition processes in vacuum, for example, chemical vapor deposition (CVD), sputtering, or vapor deposition, but also various known printing processes. The silicon film 13 may also be formed by applying a known material such as a polysilane compound, followed by annealing. The resulting silicon film 13 is composed of amorphous silicon or microcrystalline silicon and may be used as it is. In order to improve the characteristics of the transistor to be produced, the silicon film 13 may be irradiated with an energy beam, for example, a laser beam or an electron beam to cause crystallization. The degree of crystallinity of silicon in the silicon film 13 is changed between microcrystalline silicon and monocrystalline silicon depending on irradiation conditions, for example, type, energy density, and irradiation period, of the energy beam. The silicon film 13 having the form of an island may be formed by patterning using general lithography. The silicon film 13 having the form of an island may also be formed by, for example, printing so as to form the island shape without post-treatment.

An insulating film or a dielectric film, which are generally used as an interlayer insulating film, may be used as the gate insulating film 14, the interlayer insulating film being composed of a $SiO_2$ film, an inorganic SOG film, or an organic SOG film formed by a known film deposition process in vacuum, for example, CVD, sputtering, or vapor deposition; or spin coating, metal organic decomposition (MOD), anodic oxidation of metal film, sol-gel processing, or printing. The gate insulating film 14 having a predetermined shape may be formed by patterning using general lithography. The gate insulating film 14 having a predetermined shape may also be formed by, for example, printing so as to form the predetermined shape without post-treatment.

A metal film, an alloy film, polysilicon film doped with impurities, or polycide film may be used as the gate electrode 15, these films being composed of, for example, aluminum or an aluminum alloy and formed by known film deposition processes in vacuum, for example, CVD, sputtering, or vapor deposition; applying metal particles to form a layer and then sintering the resulting layer; plating; or printing. The gate electrode 15 having a predetermined shape may also be formed by, for example, printing so as to form the predetermined shape without post-treatment.

Figure 1B:
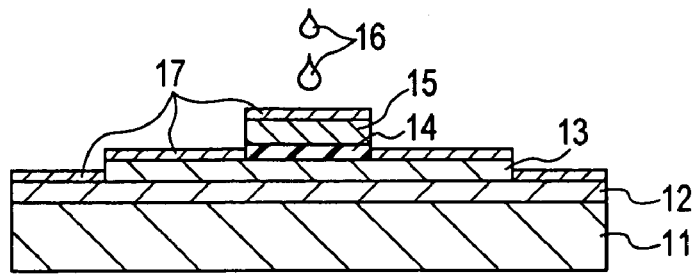

As shown in FIG. 1B, a solution 16 having a predetermined impurity ion content, for example, an aqueous solution containing boric acid ($H_3BO_3$), phosphoric acid ($H_3PO_3$), pyrophosphoric acid ($H_4P_2O_7$), or triphosphoric acid ($H_5P_3O_{10}$), is prepared at a predetermined concentration. The solution 16 is applied onto at least the surface of the silicon film 13 at both sides of the gate electrode 15 among the films provided on the substrate 11, by coating, dispersing, or printing, to form a solution layer 17. FIG. 1B shows the solution layer 17 provided on the surface of the buffer layer 12 as well as the gate electrode 15.

Figure 1C:
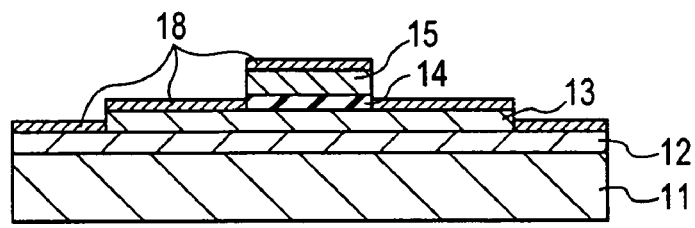

As shown in FIG. 1C, the solvent in the solution layer 17 is removed by drying or annealing, thus resulting in a compound layer 18 containing impurity ions. Complete evaporation of the solvent in the solution layer 17 is not necessarily required. As described below, as long as irradiation with an energy beam is performed without any trouble, the solvent can remain to a certain degree.

Figure 1D:
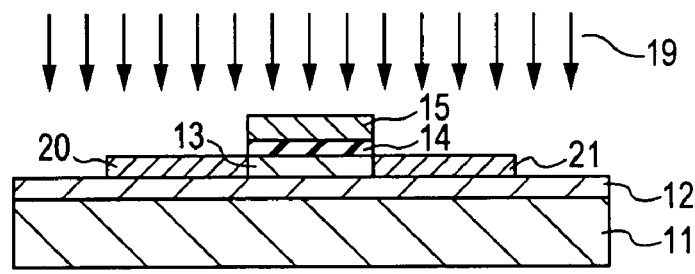

As shown in FIG. 1D, the surfaces of the films provided on the substrate 11 is irradiated with an energy beam 19 to heat the compound layer 18 and the silicon film 13, thus diffusing impurities in the compound layer 18 toward the silicon film 13. In this case, since the gate electrode 15 functions as a mask, the impurities are diffused toward the silicon film 13 except for a portion located directly below the gate electrode 15. As a result, an n-type or a p-type source region 20 and an n-type or a p-type drain region 21 are formed in a self-aligned manner depending on whether the impurities are used for forming an n-type semiconductor or for a p-type semiconductor. Subsequently, the surface of the substrate 11 is preferably washed with, for example, pure water to remove the compound layer 18 containing impurities that are not diffused into the silicon film 13.

Figure 1E:
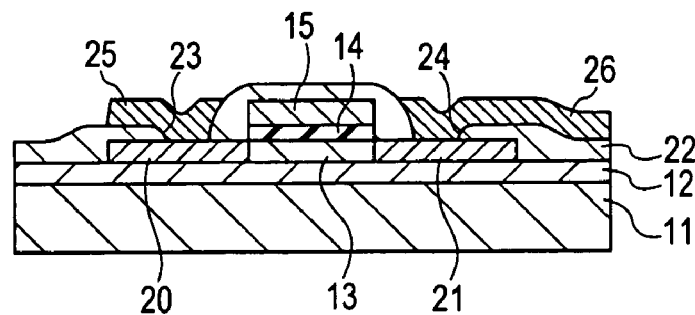

As shown in FIG. 1E, an interlayer insulating film 22 is formed over the surfaces of the films provided on the substrate 11. An insulating film or a dielectric film, which are generally used as an interlayer insulating film, may be used as the interlayer insulating film 22 similar to the gate insulating film 14, the interlayer insulating film being composed of a $SiO_2$ film, an inorganic SOG film, or an organic SOG film formed by a known film deposition process in vacuum, for example, CVD, sputtering, or vapor deposition; or spin coating, metal organic decomposition (MOD), anodic oxidation of metal film, sol-gel processing, or printing. Then, predetermined portions of the interlayer insulating film 22 are removed by etching to form contact holes 23 and 24. A source electrode 25 and a drain electrode 26 are formed through the contact holes 23 and 24, respectively.

Consequently, a target silicon TFT is produced.

According to the first embodiment described above, the solution layer 17 is formed on the surface of the silicon film 13, and then the resulting solution layer 17 is subjected to drying or annealing to form the compound layer 18. The impurity atoms in the compound layer 18 are diffused toward the silicon film 13 by irradiation with the energy beam 19 to form the source region 20 and the drain region 21. This method does not require a large vacuum pumping system and a plasma generating apparatus. By using a simple apparatus for applying a desired volume of the solution 16 onto the substrate 11 by, for example, coating, dispersing, or printing and a simple apparatus for drying the resulting solution layer 17, for example, a hot plate, the impurity ions can be absorbed on the surfaces of the films, particularly the surface of the silicon film 13, provided on the substrate 11 before the heat treatment by, for example, irradiation of the energy beam 19. Thus, the amount of impurity ions used and the capital investment can be greatly reduced. Since the impurity ion content in the solution 16 and the amount of the solution 16 applied by, for example, coating, dispersing, or printing can be easily controlled with high accuracy, the amount of impurity atoms diffused into the silicon film 13 can be easily controlled with high accuracy. Furthermore, a toxic doping gas is not needed, and the solution 16 can be used in a minimal amount, thus reducing the loads on the human body and the environment. By irradiation with the energy beam 19 in order to diffuse the impurity atoms, the compound layer 18 and the silicon film 13 provided on the substrate 11 are locally heated to high temperatures; therefore, the silicon film 13 can be heated to a temperature required for the diffusion of impurity ions without melting the substrate 11 composed of glass or a plastic, each having a low melting point. In this way, the diffusion can be performed without any trouble. In addition, an inexpensive large-sized substrate, which is composed of glass or a plastic, for the substrate 11 is readily available. Thus, an applied electronic apparatus, for example, a large-sized liquid crystal display can be produced at low cost.

EXAMPLE 1

FIGS. 2A to 2E and FIGS. 3A to 3D each show a method for producing a silicon TFT according to Example 1 of the present invention.

Figure 2A:
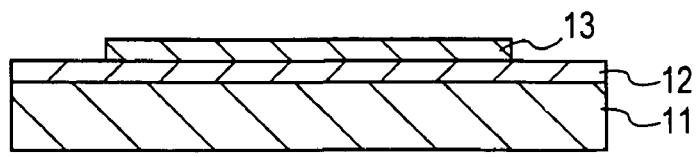
FIGS. 2 and 3 each are a cross-sectional view illustrating a method for producing a silicon TFT according to Example 1 of the present invention.

As shown in FIG. 2A, a buffer layer 12 is formed on a substrate 11, and then a silicon film 13 having a predetermined shape and being composed of amorphous silicon or microcrystalline silicon is formed on the buffer layer 12.

Figure 2B:
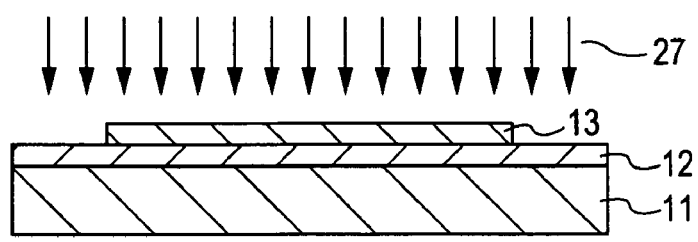

As shown in FIG. 2B, the silicon film 13 is irradiated with an energy beam 27, such as a laser beam, so as to be crystallized.

Figure 2C:
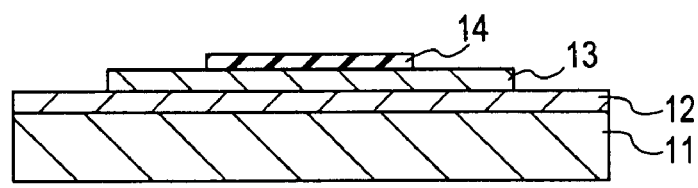

As shown in FIG. 2C, a gate insulating film 14 is formed over the surfaces of the films provided on the substrate 11. Then, the resulting gate insulating film 14 is etched so as to have a shape slightly wider than an ultimate shape.

Figure 2D:
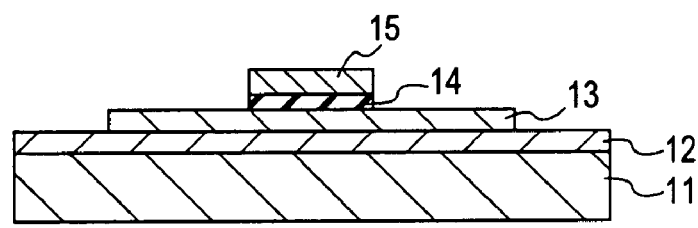

As shown in FIG. 2D, a layer composed of a material for a gate electrode 15 is formed on the gate insulating film 14. Then, the layer is etched so as to have a predetermined pattern, thus forming the gate electrode 15. The gate insulating film 14 is also etched in etching the gate electrode 15 and thus has a pattern similar to the pattern of the gate electrode 15.

Figure 2E:
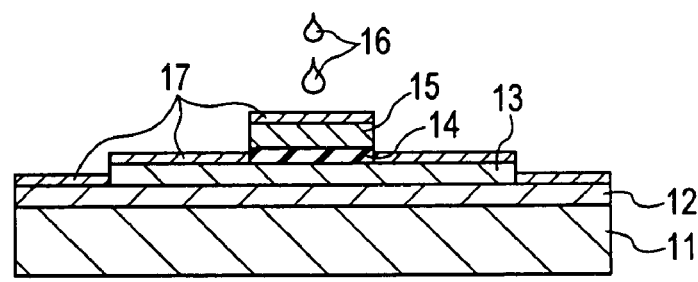

As shown in FIG. 2E, a solution 16 containing impurity ions is applied onto the surfaces of the films (including the gate electrode 15) provided on the substrate 11 to form a solution layer 17 on the surfaces of, for example, the silicon film 13.

Figure 3A:
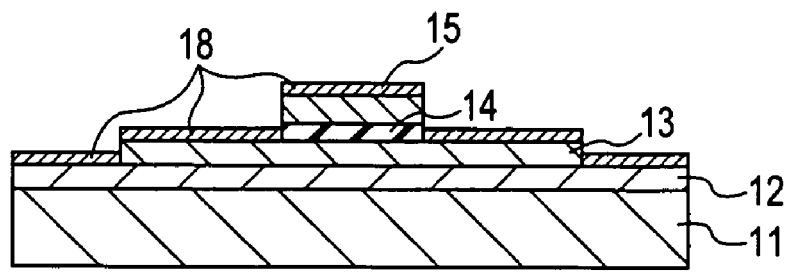

As shown in FIG. 3A, the substrate 11 is heated with a hot plate to dry the solution layer 17 into a compound layer 18 containing the impurities.

Figure 3B:
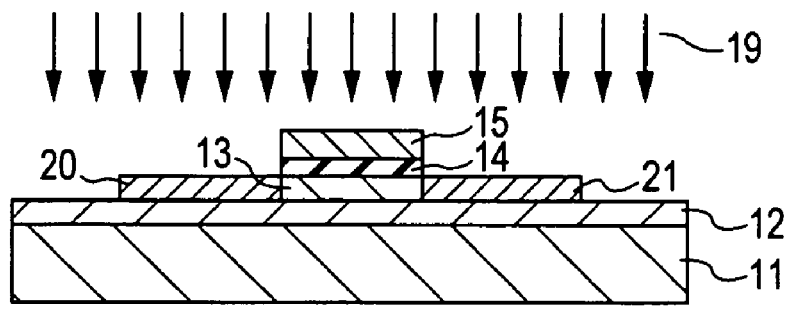

As shown in FIG. 3B, the substrate 11 is irradiated with an energy beam 19, such as a laser beam, to diffuse the impurity atoms in the compound layer 18 toward the silicon film 13; therefore, a source region 20 and a drain region 21 are formed in a self-aligned manner through the gate electrode 15 functioning as a mask. Then, the remaining compound layer 18 is removed by washing with pure water.

Figure 3C:
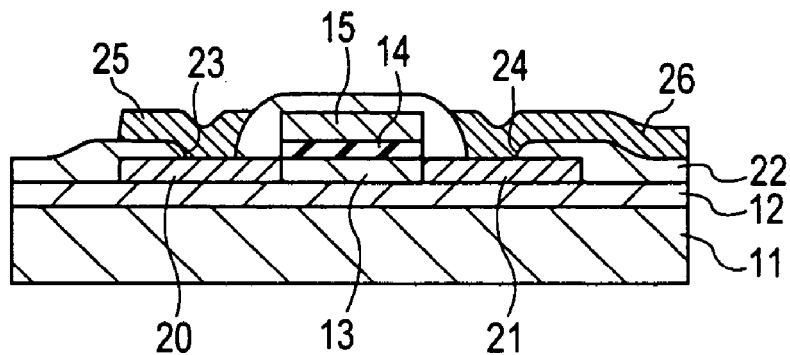

As shown in FIG. 3C, an interlayer insulating film 22 is formed over the surfaces of the films provided on the substrate 11. Then, predetermined portions of the interlayer insulating film 22 are removed by etching to form contact holes 23 and 24. A layer composed of an electrode material, for example, aluminum or an aluminum alloy is formed over the surfaces of the films provided on the substrate 11. The resulting layer is etched so as to have a predetermined pattern, to form a source electrode 25 and a drain electrode 26.

Figure 3D:
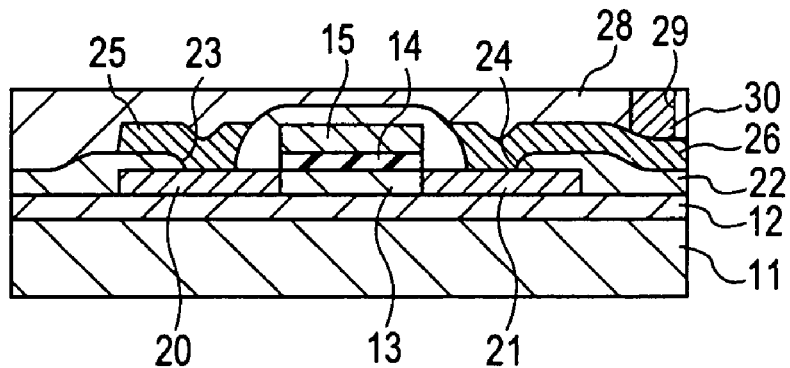

As shown in FIG. 3D, an interlayer insulating film 28 is formed over the entire surfaces of the films provided on the substrate 11. The surface of the resulting interlayer insulating film 28 is planarized. Then, a predetermined portion of the interlayer insulating film 28 on the drain electrode 26 is removed by etching to form a via hole 29. The inside of the via hole 29 is filled with a metal such as tungsten (W) to form a contact plug 30.

EXAMPLE 2

Figure 4A:
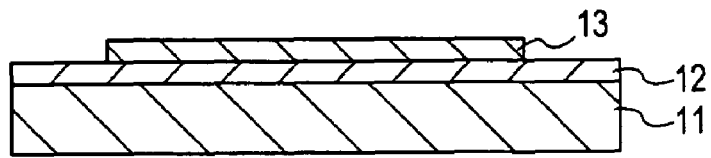
FIG. 4 is a cross-sectional view illustrating a method for producing a silicon TFT according to Example 2 of the present invention.

As shown in FIG. 4A, the film forming is performed to the step of forming a silicon film 13 having a predetermined shape as in Example 1.

Figure 4B:
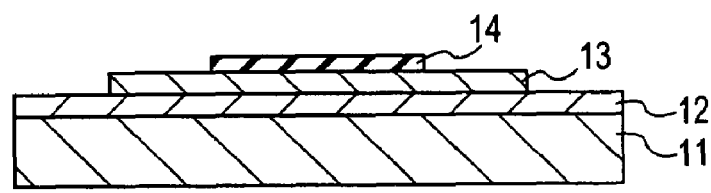

As shown in FIG. 4B, a gate insulating film 14 is formed as in Example 1 so as to have a shape slightly wider than an ultimate shape.

Figure 4C:
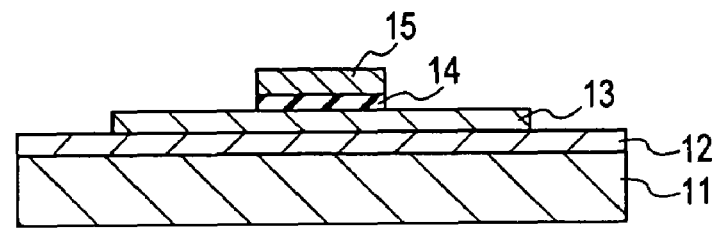

As shown in FIG. 4C, a gate electrode 15 is formed on the gate insulating film 14 as in Example 1.

Figure 4D:
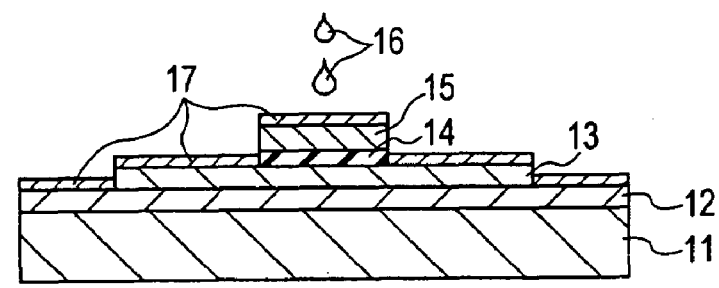

As shown in FIG. 4D, a solution layer 17 containing impurity ions is formed over, for example, the surface of the silicon film 13 as in Example 1.

Subsequently, film formation is performed from the step of drying the solution layer 17 into a compound layer 18 through the step of forming a contact plug 30 as in Example 1.

EXAMPLE 3

FIG. 5 is a cross-sectional view showing an example of a structure of an active-matrix liquid crystal display including a switching transistor in each pixel, the switching transistor being formed by the method for producing a silicon TFT according to Example 1.

As shown in FIG. 5, a buffer layer 12 is formed on a substrate 11 composed of transparent glass or a transparent plastic. Then, silicon TFTs 31 functioning as the switching transistors are formed with a two-dimensional array by the method according to Examples 1 or 2.

A transparent electrode 32 composed of, for example, indium-tin oxide (ITO) is formed on an interlayer insulating film 28. The transparent electrode 32 is connected to the drain electrode 26 in the silicon TFT 31.

The substrate 11 having the transparent electrode 32 is disposed so as to be remote from a transparent substrate 33 having a transparent electrode 34 and a color filter 35 provided on the transparent electrode 34. The gap between the substrate 11 and the transparent electrode 32 is filled with liquid crystal 36. Reference numeral 37 indicates a spacer.

A back light 38 is formed on the back surface of the substrate 11.

FIGS. 6A to 6E each show a method for producing a silicon TFT according to a second embodiment of the present invention. In fact, many silicon TFTs are simultaneously formed on the same substrate, however, only one silicon TFT is shown below.

Figure 6A:
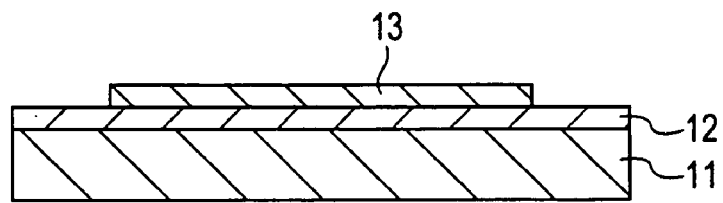
FIGS. 6 and 7 each are a cross-sectional view illustrating a method for producing a silicon TFT according to a second embodiment of the present invention.

As shown in FIG. 6A, a buffer layer 12 is formed on the substrate 11.

The substrate 11 is composed of an amorphous material, for example, glass, silica, sapphire, or a plastic; or a metal, for example, aluminum or stainless steel. The substrate 11 preferably has a thickness of 1 mm or less. In this case, a roll-to-roll process suitable for mass production is available. For the substrate 11 composed of a metal, an oxide of, for example, titanium (Ti), aluminum (Al), zirconium (Zr), or hafnium (Hf) in addition to silicon oxide, silicon nitride, or silicon carbide may be used as the buffer layer 12. The buffer layer 12 may be formed by a known film-forming processing in vacuum, for example, CVD, sputtering, or vapor deposition; or a technique for forming a general insulating layer such as an interlayer insulating layer composed of an inorganic SOG film or an organic SOG film. Furthermore, a dielectric film formed by anodic oxidation of a metal may also be used as the buffer layer 12. Sol-gel processing and MOD may also be employed for forming the buffer layer 12. For the substrate 11 composed of plastic, preferable examples of the plastic preferably include polyesters such as polyethylene terephthalate (PET), polyethylene naphthalate, and polycarbonate; polyolefins such as polypropylene; polyphenylene sulfides such as polyphenylene sulfide; polyamides; aromatic polyamides; poly(ether ketone)s; polyimides; acrylic resins; and poly(m-ethyl methacrylate)s (PMMAs). In particular, general plastics such as polyethylene terephthalate, acetates, polyphenylene sulfides, polycarbonates, poly(ether sulfone)s (PESs), polystyrenes, nylons, polypropylenes, polyvinyl chlorides, acrylic resins, or PMMAs can be suitably used.

The substrate 11 composed of plastic preferably has a smaller thickness, for example, about 200 μm in order to impart flexibility to the TFT and reduce in size of the TFT. An organic polymer layer is preferably provided on the surface of the substrate 11. The organic polymer layer has a thickness of, for example, about 10 μm and composed of an organic material having a thermal expansion coefficient lower than that of a material used for substrate 11. The organic polymer layer is preferably composed of a material capable of forming a hard coat, the material being so-called "hard coating material". The organic polymer layer preferably composed of a polymer having high density and high hardness and having a certain degree of hardness up to a relatively high temperature of 200° C.□. Examples of the polymer constituting the organic polymer layer include acrylic resins, epoxy resins, and composite polymeric materials each containing an acrylic resin and/or an epoxy resin. The acrylic resins, the epoxy resins, and the composite polymeric materials each have a three-dimensional structure resulted from polycondensation caused by an optical or thermal process.

Suitable examples of monomers used for the production of the acrylic resins include various multifunctional acrylates such as ethylene glycol di(meth)acrylate, neopentyl glycol di(meth)acrylate, bisphenol A di(meth)acrylate, trimethylolpropane tri(meth)acrylate, pentaerythritol tri(meth)acrylate, and dipentaerythritol; and bifunctional acrylates produced by allowing 2,2-bis(4'-hydroxyphenyl)hexafluoropropane or its alkylene glycol ether to react with isocyanatoalkyl methacrylate.

Various comonomers polymerizable with the above-described monomers may be used, each of the comonomers being selected depending on applications.

The polymers constituting the organic polymer layer each have a molecular weight of about 100 to 1000 and each composed of monomer units each having at least one unsaturated bond. With respect to the composition of a coating material for the organic polymer layer, the sum of reactive component content and solid component content is preferably 99 to 100 percent by weight, more preferably 99.9 to 100 percent by weight, and most preferably about 100 percent by weight. Examples of the solid component include nonvolatile solid materials such as a polymeric material and colloidal silica. Cellulose acetate butylate is suitably used as the polymeric material. The preferable coating material for the organic polymer layer is completely cured by exposure to ultraviolet rays. The coating material for the organic polymer layer contains the amount of photoinitiator required, the photoinitiator being capable of curing the coating material by irradiation of light. The coating material for the organic polymer layer may further contain a specific amount of a latent ultraviolet absorber such as resorcinol monobenzoate.

Examples of the coating material containing the epoxy resins include epoxy group-containing organosilicon compounds and its hydrolysates. Examples of monomers used for the production of the epoxy resins include γ-glycidoxypropyltrimethoxysilane, γ-glycidoxypropyltriethoxysilane, γ-glycidoxypropyltrimethoxyethoxysilane, γ-glycidoxypropyltriacetoxysilane, β-(3,4-epoxycyclohexyl)ethyltrimethoxysilane, β-(3,4-epoxycyclohexyl)ethyltriethoxysilane, β-(3,4-epoxycyclohexyl)ethyltrimethoxyethoxysilane, β-(3,4-epoxycyclohexyl)ethyltriacetoxysilane, γ-glycidoxypropyldimethoxymethylsilane, γ-glycidoxypropyldiethoxymethylsilane, γ-glycidoxypropyldimethoxyethoxymethylsilane, γ-glycidoxypropyldiacetoxymethylsilane, β-(3,4-epoxycyclohexyl)ethyldimethoxymethylsilane, β-(3,4-epoxycyclohexyl)ethyldiethoxymethylsilane, β-(3,4-epoxycyclohexyl)ethyldimethoxyethoxymethylsilane, β-(3,4-epoxycyclohexyl)ethyldiacetoxymethylsilane, γ-glycidoxypropyldimethoxyethylsilane, γ-glycidoxypropyldiethoxyethylsilane, γ-glycidoxypropyldimethoxyethoxyethylsilane, γ-glycidoxypropyldiacetoxyethylsilane, β-(3,4-epoxycyclohexyl)ethyldimethoxyethylsilane, β-(3,4-epoxycyclohexyl)ethyldiethoxyethylsilane, β-(3,4-epoxycyclohexyl)ethyldimethoxyethoxyethylsilane, β-(3,4-epoxycyclohexyl)ethyldiacetoxyethylsilane, γ-glycidoxypropyldimethoxyisopropylsilane, γ-glycidoxypropyldiethoxyisopropylsilane, γ-glycidoxypropyldimethoxyethoxyisopropylsilane, γ-glycidoxypropyldiacetoxyisopropylsilane, β-(3,4-epoxycyclohexyl)ethyldiethoxyisopropylsilane, β-(3,4-epoxycyclohexyl)ethyldiethoxyisopropylsilane, β-(3,4-epoxycyclohexyl)ethyldimethoxyethoxyisopropylsilane, β-(3,4-epoxycyclohexyl)ethyldiacetoxyisopropylsilane, γ-glycidoxypropylmethoxydimethylsilane, γ-glycidoxypropylethoxydimethylsilane, γ-glycidoxypropylmethoxyethoxydimethylsilane, γ-glycidoxypropylacetoxydimethylsilane, β-(3,4-epoxycyclohexyl)

ethylmethoxydimethylsilane, β-(3,4-epoxycyclohexyl)ethylethoxydimethylsilane, β-(3,4-epoxycyclohexyl)ethylmethoxyethoxydimethylsilane, β-(3,4-epoxycyclohexyl)ethylacetoxydimethylsilane, γ-glycidoxypropylmethoxydiethylsilane, γ-glycidoxypropylethoxydiethylsilane, γ-glycidoxypropylmethoxyethoxydiethylsilane, γ-glycidoxypropylacetoxydiethylsilane, β-(3,4-epoxycyclohexyl)ethylmethoxydiethylsilane, β-(3,4-epoxycyclohexyl)ethylethoxydiethylsilane, γ-(3,4-epoxycyclohexyl)ethylmethoxyethoxydiethylsilane, β-(3,4-epoxycyclohexyl)ethylacetoxydiethylsilane, γ-glycidoxypropylmethoxydiisopropylsilane, γ-glycidoxypropylethoxydiisopropylsilane, γ-glycidoxypropylmethoxyethoxydiisopropylsilane, γ-glycidoxypropylacetoxydiisopropylsilane, β-(3,4-epoxycyclohexyl)ethylmethoxydiisopropylsilane, β-(3,4-epoxycyclohexyl)ethylethoxydiisopropylsilane, β-(3,4-epoxycyclohexyl)ethylmethoxyethoxydiisopropylsilane, β-(3,4-epoxycyclohexyl)ethylacetoxydiisopropylsilane, γ-glycidoxypropylmethoxyethoxymethylsilane, γ-glycidoxypropylacetoxymethoxymethylsilane, γ-glycidoxypropylacetoxyethoxymethylsilane, β-(3,4-epoxycyclohexyl)ethylmethoxyethoxymethylsilane, β-(3,4-epoxycyclohexyl)ethylmethoxyacetoxymethylsilane, β-(3,4-epoxycyclohexyl)ethylethoxyacetoxymethylsilane, γ-glycidoxypropylmethoxyethoxyethylsilane, γ-glycidoxypropylacetoxymethoxyethylsilane, γ-glycidoxypropylacetoxyethoxyethylsilane, β-(3,4-epoxycyclohexyl)ethylmethoxyethoxyethylsilane, β-(3,4-epoxycyclohexyl)ethylmethoxyacetoxyethylsilane, β-(3,4-epoxycyclohexyl)ethylethoxyacetoxyethylsilane, γ-glycidoxypropylmethoxyethoxyisopropylsilane, γ-glycidoxypropylacetoxymethoxyisopropylsilane, γ-glycidoxypropylacetoxyethoxyisopropylsilane, β-(3,4-epoxycyclohexyl)ethylmethoxyethoxyisopropylsilane, β-(3,4-epoxycyclohexyl)ethylmethoxyacetoxyisopropylsilane, β-(3,4-epoxycyclohexyl)ethylethoxyacetoxyisopropylsilane, glycidoxymethyltrimethoxysilane, glycidoxymethyltriethoxysilane, α-glycidoxyethyltrimethoxysilane, α-glycidoxymethyltrimethoxysilane, β-glycidoxyethyltrimethoxysilane, β-glycidoxymethyltrimethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltrimethoxysilane, β-glycidoxybutyltriethoxysilane, γ-glycidoxybutyltrimethoxysilane, γ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylmethyldiethoxysilane, α-glycidoxypropylmethyldimethoxysilane, α-glycidoxypropylmethyldiethoxysilane, β-glycidoxypropylmethyldimethoxysilane, β-glycidoxypropylmethyldiethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldimethoxyethoxysilane, γ-glycidoxypropylmethyldiphenoxysilane, γ-glycidoxypropylethyldimethoxysilane, γ-glycidoxypropylethyldiethoxysilane, γ-glycidoxypropylethyldipropoxysilane, γ-glycidoxypropylvinyldimethoxysilane, and γ-glycidoxypropylvinyldiethoxysilane.

These compounds may be used alone or in combination, if necessary. These compounds may also be used together with any other silane compounds. Examples of the other silane compound include trialkoxysilane compounds such as methyltrimethoxysilane, methyltriethoxysilane, vinyltrimethoxysilane, vinyltriethoxysilane, vinyltrimethoxyethoxysilane, γ-methacryloxypropyltrimethoxysilane, aminomethyltrimethoxysilane, 3-aminopropyltrimethoxysilane, 3-aminopropyltriethoxysilane, phenyltrimethoxysilane, phenyltriethoxysilane, γ-chloropropyltrimethoxysilane, γ-mercaptopropyltriethoxysilane, and 3,3,3-trifluoropropyltrimethoxysilane; triacyloxysilane compounds such as vinyltriacetoxysilane; trialkoxyalkoxysilane compounds; dialkoxysilane compounds such as dimethyldimethoxysilane, diphenyldimethoxysilane, methylphenyldimethoxysilane, methylvinyldimethoxysilane, and dimethyldiethoxysilane; and silane compounds having a functionality of four, such as methyl silicate, ethyl silicate, isopropyl silicate, n-propyl silicate, n-butyl silicate, tert-butyl silicate, and sec-butyl silicate.

It is to be understood here that the above-described monomers for the production of the polymer constituting the organic polymer layer are merely examples.

The organic polymer layer is formed as follows: the above-described acrylic resin, epoxy resin, or polymeric material containing an acrylic resin and/or an epoxy resin is mixed with filler, water, and/or an organic solvent, if necessary. The mixture is mixed with, for example, a paint shaker, a sand mill, a pearl mill, a ball mill, attritor, roll mill, a high-speed impeller dispersing machine, jet mill, high-speed impact mill, or ultrasonic dispersing machine, to produce a coating material. In the case of the resulting coating material with poor adhesion to the substrate composed of plastic, the substrate preferably has an adhesive layer. The adhesive layer may be simultaneously formed on the substrate in producing the substrate composed of a plastic film or may be formed by coating after the plastic film is produced.

The coating material is applied on a side or both sides of the substrate in a single operation or several operations by a coating method, for example, spin coating, air doctor coating, blade coating, knife coating, reverse coating, transfer roll coating, gravure roll coating, kiss coating, cast coating, spray coating, slot orifice coating, calendar coating, electrodeposition coating, dip coating, or die coating; letterpress such as flexography; intaglio printing such as direct gravure printing or offset gravure printing; surface printing such as offset printing; or mimeograph such as screen printing. When the coating material contains a solvent, the coated layer is heated to remove the solvent.

If necessary, a solution containing a polysilazane compound or a solution containing a siloxane compound, each solution compound having a methyl group content of 0 to 50 percent by weight, and preferably 0 to 30 percent by weight, is applied by a coating method, for example, spin coating, air doctor coating, blade coating, knife coating, reverse coating, transfer roll coating, gravure roll coating, kiss coating, cast coating, spray coating, slot orifice coating, calendar coating, electrodeposition coating, dip coating, or die coating; letterpress such as flexography; intaglio printing such as direct gravure printing or offset gravure printing; surface printing such as offset printing; or mimeograph such as screen printing. The resulting layer is dried and then heated or irradiated with ultraviolet rays to form a buffer layer 12 composed of a substantially inorganic material but may contains organic material. The dried layer may be heated in a water vapor atmosphere in some cases. In this way, the substrate composed of a plastic film is imparted improved heat resistance against heating at relatively high temperature from the buffer layer side because of the effect of the buffer layer 12 combined with the organic polymer layer. This brings about significant advantages to the production.

A silicon film 13, which is composed of amorphous silicon or microcrystalline silicon, having a predetermined shape is formed on the buffer layer 12. The silicon film 13 may be used as it is. In order to improve the characteristics of the transistor to be produced, the silicon film 13 may be irradiated with an energy beam, for example, a laser beam or an electron beam to cause crystallization. The degree of crystallinity of silicon in the silicon film 13 is changed between microcrystalline silicon and monocrystalline silicon depending on irradiation conditions, for example, type, energy density, and irradiation period, of the energy beam.

A solution containing polysilane compound and a solvent is applied onto the buffer layer 12 and dried, followed by annealing, to form the silicon film 13. The application is performed in a single operation or several operations by spin coating, air doctor coating, blade coating, knife coating, reverse coating, transfer roll coating, gravure roll coating, kiss coating, cast coating, spray coating, slot orifice coating, calendar coating, electrodeposition coating, dip coating, or die coating; letterpress such as flexography; intaglio printing such as direct gravure printing or offset gravure printing; surface printing such as offset printing; or mimeograph such as screen printing. The silicon film 13 having the form of the channel pattern is preferably formed by printing in order to omit the subsequent patterning step by etching. Examples of the solvent include ethers such as diethyl ether, dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, 1,2-dimethoxyethane, and p-dioxane; hydrocarbons such as n-pentane, n-hexane, n-heptane, n-octane, decane, dodecane, cyclohexane, cyclooctane, styrene, dicyclopentane, benzene, toluene, xylenes, cumene, durene, indene, tetrahydronaphthalene, decahydronaphthalene, and squalane; polar solvents such as propylene carbonate, γ-butyrolactone, N-methyl-2-pyrrolidone, dimethylformamide, acetonitrile, dimethyl sulfoxide, methylene chloride, and chloroform. These solvents may be used alone or in combination, if necessary. The content of the polysilane compound is adjusted as appropriate so that the silicon film 13 has a desired thickness. The applied solution on the substrate is dried and annealed to form the silicon film 13. Furthermore, a mixture of silicon nanoparticles dispersed in a solvent may be used in order to change the crystallinity of the silicon film 13.

An example of a method for producing the silicon TFT 31 will be described below. This is the case of the silicon film 13 provided on the substrate 11 composed of glass. A polysilane compound was dissolved into a solvent to prepare a solution. Next, 40 g of the resulting solution was homogenized in nitrogen atmosphere. The solution containing the polysilane compound thus prepared was spin-coated onto glass substrates at 3,000 rpm in argon atmosphere, and then the resulting films were prebaked at 200° C. for 2 minutes. Each of the films was baked at the following conditions: (Sample A) at 400° C. for 10 minutes; (Sample B) at 350° C. for 20 minutes; (Sample C) at 300° C. for 1 hour; and (Sample D) at 250° C. for 1 hour. As a result, amorphous silicon films, each having a thickness of about 100 nm, were formed on the glass substrate. Analysis with FT-IR showed that peaks assigned to Si—H bonding were observed but no peak assigned to Si—H$_2$ bonding, Si—H$_3$ bonding, and —(Si—H$_2$)n— bonding in Samples A, B, and C. Therefore, it was confirmed that these resulting films were excellent amorphous silicon films. In Sample D, shoulder peak assigned to Si—H$_2$ bonding was slightly observed. Since the shoulder peak was very slight, this film was relatively good amorphous silicon film.

Figure 6B:
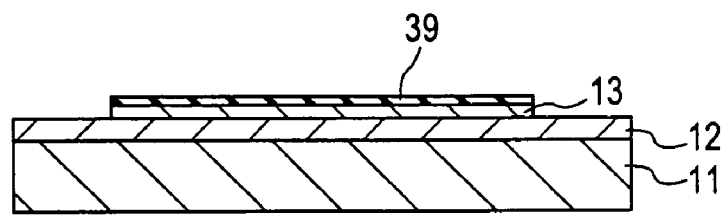

As shown in FIG. 6B, a thin oxide film 39 is formed on the surface of the resulting silicon film 13. The oxide film 39 may be omitted depending on the quality of an insulating film subsequently formed by coating. On the contrary, the insulating film may be omitted depending on the thickness of the oxide film 39. That is, the oxide film 39 can be entirely or partially used as the gate insulating film. A specific process for forming the oxide film 39 will now be described. The oxide film 39 is formed by ozone oxidation or a surface oxidation process by atmospheric pressure CVD (including a low vacuum state generated with a simple evacuation system). With respect to atmospheric plasma treatment, direct plasma processing in which a substrate disposed between electrodes is directly irradiated with plasma and remote plasma processing in which plasma is allowed to impinge on a substrate, like a hair-dryer, are known. The remote plasma processing is preferable due to low damage for the substrate. In the direct plasma processing, the substrate is fixed in the plasma or scanned with the plasma. In the remote plasma processing, the substrate is scanned with the plasma. The film on the substrate is modified by exposure to activated species such as electrons, ions, or radicals in the plasma. The temperature of the substrate may be set between room temperature and 450° C. An oxygen gas and NO$_x$ gases may be used. For the use of an oxygen gas, the CVD can be performed at an atmospheric pressure. For the use of a highly oxidative gas, in view of the effect on the human body and the environment, it is preferred that the process room used be entirely covered like a chamber and locally evacuated with a simple evacuation system. In this case, a vacuum state in which back pressure is lower than 10 kPa is not required.

An example of a process for forming the oxide film 39 will now be described. The substrate 11 was placed in a chamber for atmospheric pressure CVD, the amorphous silicon film 13 facing upward. The temperature of the substrate 11 was set at 250° C. An oxygen gas was introduced between parallel plate electrodes at 50 to 300 sccm. Plasma was generated by applying bias RF power of 20 to 25 W with an RF power supply having 600 W RF power at 13.56 MHz. The scan speed was changed between 1 to 240 mm/min. Analysis with a secondary ion mass spectrometer (SIMS) and a scanning electron microscope (SEM) showed that the oxide film 39 having a thickness of about 10 to 40 nm was formed on the surface of the silicon film 13.

When the oxide film 39 is formed by ozone oxidation, the substrate 11 is placed in a high concentration ozone gas and exposed to the ozone gas to modify the surface of the silicon film 13. The temperature of the substrate is set between room temperature and 450° C. A specific example will be described below. The substrate 11 was placed in an apparatus, the amorphous silicon film 13 facing upward. The temperature of the substrate 11 was set at 250° C. The surface of the silicon film 13 was exposed to the ozone gas for 20 to 120 seconds, to form the oxide film 39 having a thickness of about 10 to 40 nm. More preferably, an oxide film is formed on the surface of the silicon film 13 by the above-described oxidation process and then the resulting oxide film is removed as a sacrificial oxide layer. Then, the oxide film 39 may be formed by the above-described process.

Figure 6C:
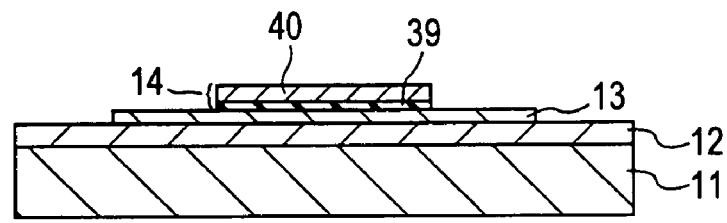

As shown in FIG. 6C, an oxide film 40 is formed on the oxide film 39 by coating. An integrated whole that is composed of the oxide film 39 and the oxide film 40 results in a gate insulating film 14. The oxide film 40 is principally composed of a siloxane compound or a polysilazane compound. Each of the siloxane compound or the polysilazane compound preferably has a methyl group content of 0 to 50 percent by weight, and more preferably 0 to 30 percent by weight. Examples of a solvent used for coating include ethers such as diethyl ether, dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, 1,2-dimethoxyethane, and p-dioxane; and hydrocarbons such as n-pentane, n-hexane, n-heptane, n-octane, decane, dodecane, cyclohexane, cyclooctane, styrene, dicyclopentane, benzene, toluene, xylenes, cumene, durene, indene, tetrahydronaphthalene, decahydronaphthalene, and squalane; polar solvents such as propylene carbonate, γ-butyrolactone, N-methyl-2-pyrrolidone, dimethylformamide, acetonitrile, dimethyl sulfoxide, methylene chloride, and chloroform. These solvents may be used alone or in combination, if necessary. The amount of solvent used is adjusted as appropriate so that the oxide film 40 has a desired thickness. The application is performed in a single operation or several operations by spin coating, air doctor coating, blade coating, knife coating, reverse coating, transfer roll coating, gravure roll coating, kiss coating, cast coating, spray coating, slot orifice coating, calendar coating, electrodeposition coating, dip coating, or die coating; letterpress such as flexography; intaglio printing such as direct gravure printing or offset gravure printing; surface printing such as offset printing; or mimeograph such as screen printing. The silicon film 13 having the form of the channel pattern is preferably formed by printing in order to omit the subsequent patterning step by etching. The applied solution is dried and baked to form an insulating film composed of a silicon oxide.

An example of a process for forming the oxide film 40 provided directly on a glass substrate will be described below. A polysilazane compound was dissolved in a xylene solvent. The resulting solution was spin-coated on surfaces of the glass substrates at 1,200 rpm. Then, each of the resulting films was prebaked at 110° C. for 1 minute and annealed on a hot plate at the following conditions: at 150° C. for 30 minutes; at 250° C. for 30 minutes; or 350° C. for 30 minutes. As a result, silicon oxide films having a thickness of about 200 nm were formed on the glass substrates. The silicon film annealed at 350° C. for 30 minutes showed an excellent insulating strength of 4 to 5 MV/cm. Another example of a process for forming the oxide film 40 will be described below. A polysilazane compound was dissolved in a xylene solvent. The resulting solution was spin-coated on a surface of the glass substrate at 3,500 rpm. Then, the resulting film was prebaked at 110° C. for 1 minute on a hot plate. The entire surface of the film was exposed for 3 seconds and then placed at 25° C. for 4 minutes in a humidified atmosphere having a relative humidity of 80 percent. The resulting film was postbaked at 150° C. for 3 minutes and then annealed at 350° C. for 30 minutes on the hot plate. The resulting silicon oxide film showed an excellent insulating strength of 5 MV/cm or more.

Subsequently, if necessary, the resulting oxide film 40 is modified. The oxide film 40 annealed at a low temperature has unreacted monomer, which causes the deterioration of electrical properties; hence, this modification is effective. The modification is performed by atmospheric pressure CVD or ozone oxidation. In this case, atmospheric pressure remote plasma processing is also preferable due to low damage for the substrate. The temperature of the substrate is set between room temperature and 450° C. An oxygen gas and $NO_x$ gases may be used. For the use of an oxygen gas, the CVD or the ozone oxidation can be performed at an atmospheric pressure. For the use of a highly oxidative gas, in view of the effect on the human body and the environment, it is preferred that the process room used be entirely covered like a chamber and locally evacuated with a simple evacuation system. In this case, a vacuum state in which back pressure is lower than 10 kPa is not required similar to the above-described process. An example of the modification process will be described below. The substrate 11 was placed in a chamber for atmospheric pressure CVD, the oxide film 40 facing upward. The temperature of the substrate 11 was set at 250° C. An oxygen gas was introduced between parallel plate electrodes at 50 to 300 sccm. Plasma was generated by applying bias RF power of 20 to 25 W with an RF power supply having 600 W RF power at 13.56 MHz. The scan speed was changed between 1 to 210 mm/min. If necessary, the substrate 11 was scanned several times. As a result, the insulating strength of the oxide film 40 annealed at 200° C. to 350° C. was improved about 1 MV/cm on an average. Furthermore, hysteresis characteristics were improved in producing the oxide film 40 as a gate capacitor.

When the silicon film 13 or the oxide films 39 and 40 each are not in the form of an island, patterning is performed as described below, but provided that the oxide films 39 and 40 are provided on the amorphous silicon film 13 on the buffer layer 12 composed of silica ($SiO_2$). A resist is applied on the oxide film 40. The application of the resist is performed in a single operation or several operations by spin coating, air doctor coating, blade coating, knife coating, reverse coating, transfer roll coating, gravure roll coating, kiss coating, cast coating, spray coating, slot orifice coating, calendar coating, electrodeposition coating, dip coating, or die coating; letterpress such as flexography; intaglio printing such as direct gravure printing or offset gravure printing; surface printing such as offset printing; or mimeograph such as screen printing. Then, the applied resist may be exposed through a mask. In order to omit the step, the resist film having the form of the channel pattern is preferably formed by printing. In this way, the resist film having a desired island shape is formed after exposure and development.

The oxide films 39 and 40, which are composed of $SiO_2$, are etched through the resist film by atmospheric pressure plasma processing. The substrate 11 was placed in a chamber for atmospheric pressure CVD, the oxide film 40 facing upward. The temperature of the substrate 11 was set at 80° C. A mixed gas containing trifluoromethane ($CHF_3$) and $O_2$ was introduced between parallel plate electrodes. The oxide films 39 and 40 were etched by plasma generated by applying RF power of 35 W. In this case, $SiO_2$ constituting the oxide films 39 and 40 was etched at a rate of 34 nm/s. Si constituting the silicon film 13 was etched at a rate of 3.3 nm/s. As a result, the oxide films 39 and 40 can be etched with a $SiO_2/Si$ etching selectivity of about 10.

Subsequently, the silicon film 13 is etched by atmospheric pressure plasma processing. The temperature of the substrate 11 was set at 80° C. A sulfur hexafluoride ($SF_6$) gas was introduced between parallel plate electrodes at 50 sccm. The silicon film 13 was etched by plasma generated by applying RF power of 35 W. In this case, Si constituting the silicon film 13 was etched at a rate of 50 nm/s. $SiO_2$ constituting the buffer layer 12 provided under the silicon film 13 was etched at a rate of 8 nm/s. As a result, the silicon film 13 can be etched with a $SiO_2/Si$ etching selectivity of about 6.3. Etching was performed as described above, but the $SF_6$ gas was introduced at 40 sccm and the RF power was 2 W. In this case, Si constituting the silicon film 13 was etched at a rate of 18 nm/s. $SiO_2$ constituting the buffer layer 12 provided under the silicon film 13 was etched at a rate of 0.7 nm/s. As a result, the silicon film 13 can be etched with a $SiO_2/Si$ etching selectivity of about 25.7. In the both conditions, in view of the effect on the human body and the environment, it is preferred that the process room used be entirely covered like a chamber and locally evacuated with a simple evacuation system, and then the evacuated gas was preferably treated with a exhaust gas treatment system.

Figure 6D:
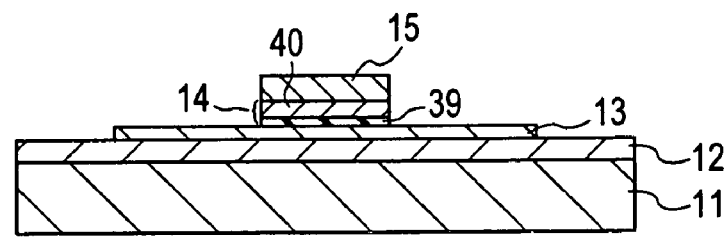

Next, as shown in FIG. 6D, a gate electrode 15 is formed. The gate electrode 15 may be formed by applying a precursor for plating; or by coating a mixture containing metal nanoparticles dispersed in a solvent and then sintering. The application may be performed by spin coating, air doctor coating, blade coating, knife coating, reverse coating, transfer roll coating, gravure roll coating, kiss coating, cast coating, spray coating, slot orifice coating, calendar coating, electrodeposition coating, dip coating, or die coating; letterpress such as flexography; intaglio printing such as direct gravure printing or offset gravure printing; surface printing such as offset printing; or mimeograph such as screen printing. The application is preferably performed so that the applied material has the same shape as the gate electrode 15. If difficult, a resist is applied by the above-described process, and then an electrode pattern is formed by etching through the resulting resist film functioning as an etching mask. For plating, the precursor is applied and plated in a plating bath, followed by being washed, dried, and postbaked. An example of a process for the gate electrode 15 by applying a mixture containing metal nanoparticles dispersed in a solvent and then sintering will be described below. Silver (Ag) nanoparticles having an average particle size of 10 nm were dispersed into a solvent and spin-coated on a glass substrate at 1,000 to 5,000 rpm. Then, the resulting specimen was annealed at 200° C. for 60 minutes on a hot plate in air. A specimen formed at 3,500 rpm was annealed to form a silver film having metallic luster and having a thickness of about 300 nm on the glass substrate. Analysis with energy-dispersive X-ray diffraction (EDX) showed that a peak assigned to Ag was observed and a peak assigned to impurity carbon was very slightly observed. Observation with SEM showed that the grain growth of Ag particles occurred and thus each of the Ag particles had a particle size of about 60 nm. A resist was applied by screen printing and etched. It was confirmed that patterning can be performed. Subsequently, the patterned gate electrode 15 was plated with gold (Au). The plating is not necessarily required. Any other metals such as nickel (Ni), copper (Cu), or Ag may be used.

The oxide films 39 and 40 were etched with a mixed aqueous solution containing hydrofluoric acid and ammonium fluoride through the gate electrode 15 functioning as a mask. When the substrate was composed of glass, etching can be performed by immersing the substrate in the mixed solution after a resist was spin-coated on the back surface of the substrate.

Figure 7A:
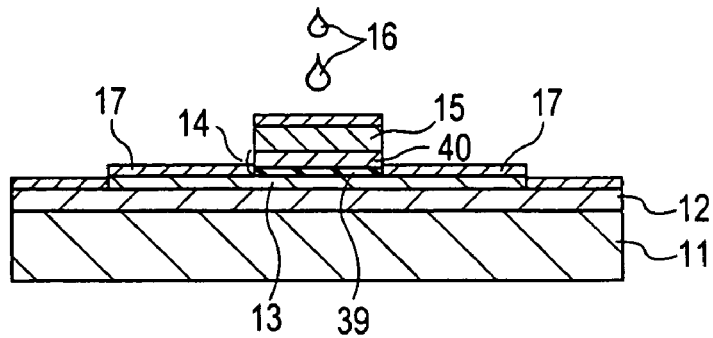

As shown in FIG. 7A, a solution having a predetermined impurity ion content, for example, an aqueous solution containing boric acid ($H_3BO_3$) or borax (sodium tetraborate); or phosphoric acid ($H_3PO_3$), pyrophosphoric acid ($H_4P_2O_7$), or triphosphoric acid ($H_5P_3O_{10}$), is prepared at a predetermined concentration. The solution 16 is applied onto at least the surface of the silicon film 13 at both sides of the gate electrode 15 among the films provided on the substrate 11, by coating, dispersing, or printing, to form a solution layer 17. FIG. 7A shows the solution layer 17 provided on the surface of the buffer layer 12 as well as the gate electrode 15. The solution 16 can be applied by spin coating, air doctor coating, blade coating, knife coating, reverse coating, transfer roll coating, gravure roll coating, kiss coating, cast coating, spray coating, slot orifice coating, calendar coating, electrodeposition coating, dip coating, or die coating; letterpress such as flexography; intaglio printing such as direct gravure printing or offset gravure printing; surface printing such as offset printing; or mimeograph such as screen printing.

The solvent in the solution layer 17 is removed by drying or annealing similar to FIG. 1C, thus resulting in a compound layer 18 containing impurity ions. Complete evaporation of the solvent in the solution layer 17 is not necessarily required. As described below, as long as irradiation with an energy beam is performed without any trouble, the solvent can remain to a certain degree.

Figure 7B:
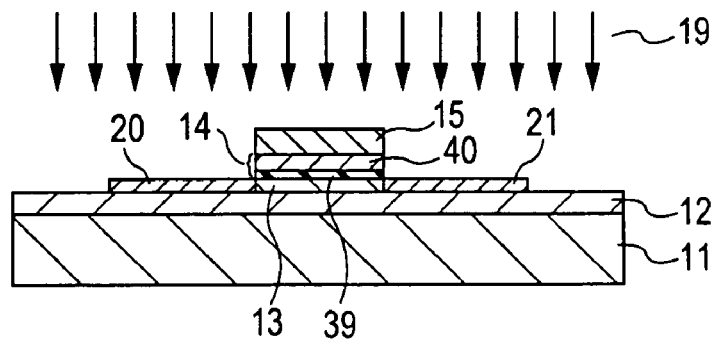

As shown in FIG. 7B, the surfaces of the films provided on the substrate 11 is irradiated with an energy beam 19 to heat the compound layer 18 and the silicon film 13, thus diffusing impurities in the compound layer 18 toward the silicon film 13. In this case, since the gate electrode 15 functions as a mask, the impurities are diffused toward the silicon film 13 except for a portion located directly below the gate electrode 15. As a result, an n-type or a p-type source region 20 and an n-type or a p-type drain region 21 are formed in a self-aligned manner depending on whether the impurities are used for forming an n-type semiconductor or for a p-type semiconductor. Subsequently, the surface of the substrate 11 is preferably washed with, for example, pure water to remove the compound layer 18 containing impurities that are not diffused into the silicon film 13.

Figure 8:
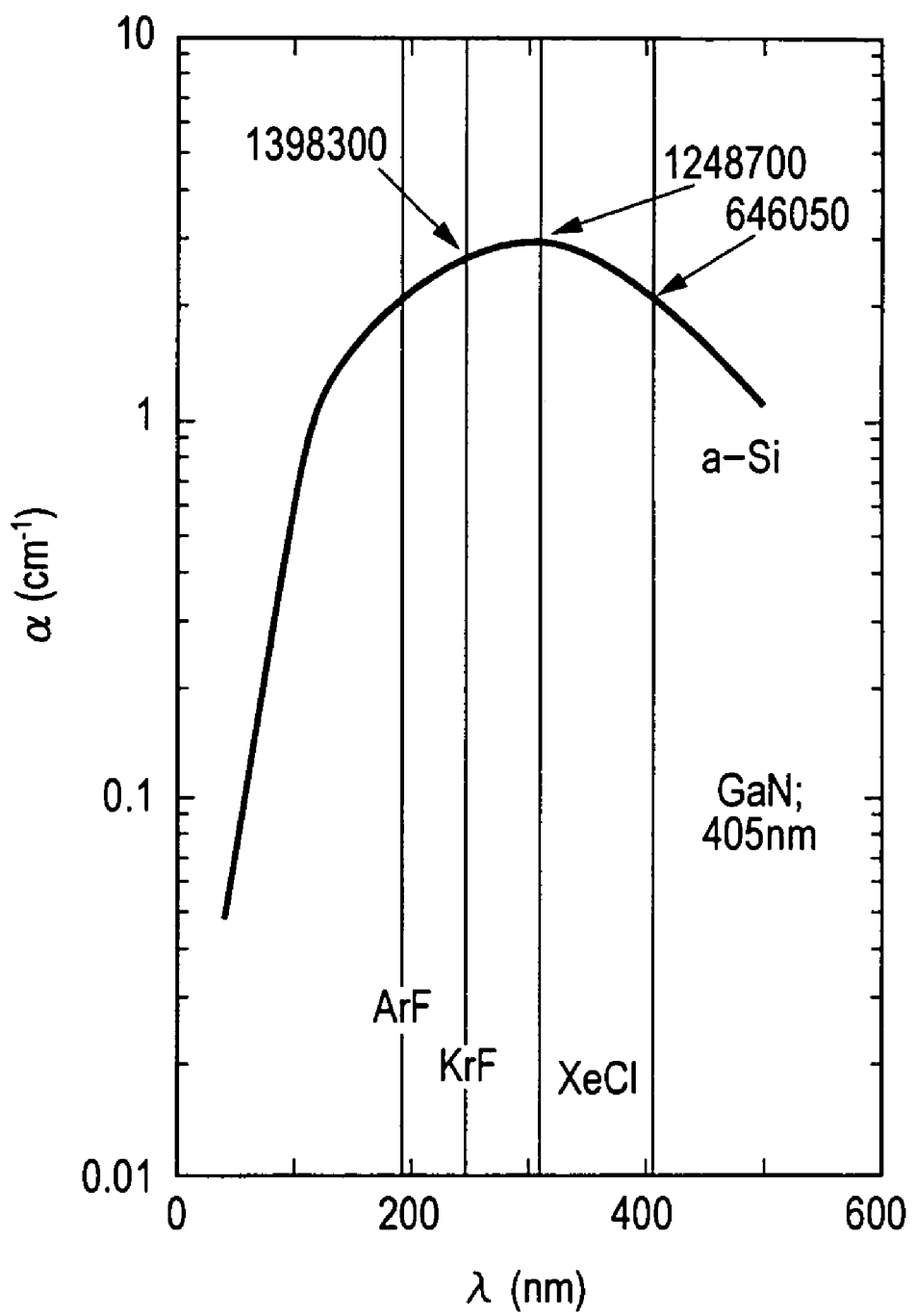
FIG. 8 is a graph showing the change in absorption coefficient with respect to the wavelength of a laser beam.

A laser beam is suitably used as an energy beam 19. Examples of the laser beam include a 405 nm laser beam emitted from a gallium nitride (GaN) semiconductor laser, a 308 nm laser beam emitted from a xenon chloride (XeCl) excimer laser, a 248 nm laser beam emitted from a krypton fluoride (KrF) excimer laser, and a 193 nm laser beam emitted from an argon fluoride (ArF) excimer laser. As shown in FIG. 8, the silicon film 13 has a satisfactorily large absorption coefficient to those laser beams. In FIG. 8, $\alpha$ represents absorption coefficient and $\gamma$ represents wavelength.

An example of a process for forming a source region 20 and a drain region 21 will be described below. The gate insulating film 14 and the gate electrode 15 were formed on the silicon film 13 by patterning according to the above-described process. An aqueous solution containing 0.2 M boric acid was spin-coated at 2,000 rpm and dried at 200° C. for 20 minutes on a hot plate and then irradiated with a 308 nm laser beam, which has a rectangular shape of 200 mm×400 mm, emitted from a XeCl excimer laser. Scanning along the shorter axis was performed in an argon atmosphere at the following conditions: pulse energy: 260 mJ/cm²; pulse width: 25 nsec; and the number of shots: 50 shots/area. In order to avoid the ablation of the film, the profile of cross-section of the shorter axial side of the laser beam was optically adjusted so as to round sharp edges. As a result of the irradiation with the laser beam, the silicon film 13 with a thickness of 100 nm had a sheet resistance of 300 Ω/□. It was confirmed that the source region 20 and the drain region 21 each had a doping concentration of $8 \times 10^{19}/cm^3$. Subsequently, the silicon film 13 was washed with pure water to remove excess impurities on, for example, the gate electrode 15. In this process, only the portions of the silicon film 13 at both sides of the gate electrode 15 were activated and thus the source region 20 and the drain region 21 were formed in a self-aligned manner to the gate electrode 15.

Another example of a process for forming a source region 20 and a drain region 21 will be described below. The gate insulating film 14 and the gate electrode 15 were formed on the silicon film 13 by patterning according to the above-described process. An aqueous solution containing 0.2 M boric acid was spin-coated at 2,000 rpm and dried at 200° C. for 20 minutes on a hot plate and then irradiated with a 405 nm laser beam having an output power of 200 mW emitted from a blue-violet GaN semiconductor laser. The shape of the laser beam was adjusted to an ellipse with a major axis of 15 µm and a minor axis of 10 µm. The alignment of the laser beam was performed so that the portions of the silicon film 13 at both sides of the gate electrode 15 were irradiated at the same time or sequentially with the laser beam. The experiment was performed at 100 kHz to 100 MHz in an argon atmosphere. As a result of the irradiation of the laser beam, the silicon film 13 with a thickness of 100 nm had a sheet resistance of $1 \times 10^4$ Ω/□. It was confirmed that the source region 20 and the drain region 21 each had a doping concentration of $4 \times 10^{17}/cm^3$.

Another example of a process for forming a source region 20 and a drain region 21 will be described below. The gate insulating film 14 and the gate electrode 15 were formed on the silicon film 13 by patterning according to the above-described process. An aqueous solution containing 0.05 M boric acid was spin-coated at 2,000 rpm and dried at 200° C. for 20 minutes on a hot plate and then irradiated with a 355 nm laser beam, which has a rectangular shape of 2 mm×4 mm, emitted from a YAG laser. The alignment of the laser beam was performed so that the portions of the silicon film 13 at both sides of the gate electrode 15 were irradiated at the same time or sequentially with the laser beam. Irradiation period was set at 15 to 150 nsec in this experiment. As a result of the irradiation of the laser beam, the silicon film 13 with a thickness of 100 nm had a sheet resistance of 1 kΩ/□. It was confirmed that the source region 20 and the drain region 21 each had a doping concentration of $4 \times 10^{18}/cm^3$. Subsequently, the silicon TFT 31 was washed with pure water to remove excess impurities on, for example, the gate electrode 15. In this process, only the portions of the silicon film 13 at both sides of the gate electrode 15 were activated and thus the source region 20 and the drain region 21 were formed in a self-aligned manner to the gate electrode 15.

Another example of a process for forming a source region 20 and a drain region 21 will be described below. The gate insulating film 14 and the gate electrode 15 were formed on the silicon film 13 by patterning according to the above-described process. An aqueous solution containing 0.15 M phosphoric acid was spin-coated at 1,500 rpm and dried at 200° C. for 20 minutes on a hot plate and then irradiated with a 405 nm laser beam having an output power of 200 mW emitted from a blue-violet GaN semiconductor laser. The shape of the laser beam was adjusted to an ellipse with a major axis of 15 µm and a minor axis of 10 µm. The alignment of the laser beam was performed so that the portions of the silicon film 13 at both sides of the gate electrode 15 were irradiated at the same time or sequentially with the laser beam. The experiment was performed at 100 kHz to 100 MHz in an argon atmosphere. As a result of the irradiation of the laser beam, the silicon film 13 with a thickness of 100 nm had a sheet resistance of 2 kΩ/□. It was confirmed that the source region 20 and the drain region 21 each had a doping concentration of $4 \times 10^{18}/cm^3$.

Figure 7C:
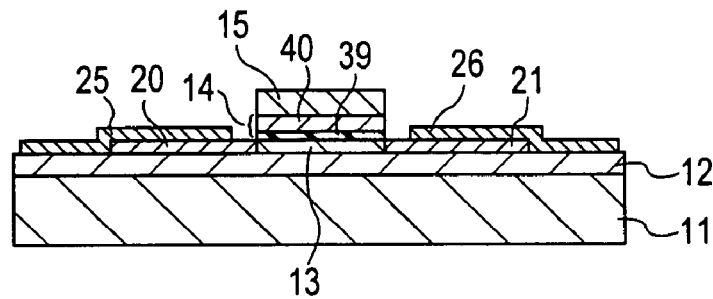

As shown in FIG. 7C, a source electrode 25 and a drain electrode 26 are formed on the source region 20 and the drain region 21, respectively. The source electrode 25 and the drain electrode 26 can be formed by the same process as that for forming the gate electrode 15. For example, the source electrode 25 and the drain electrode 26 may be formed by applying a precursor for plating; or by coating a mixture containing metal nanoparticles dispersed in a solvent and then sintering. The application may be performed by spin coating, air doctor coating, blade coating, knife coating, reverse coating, transfer roll coating, gravure roll coating, kiss coating, cast coating, spray coating, slot orifice coating, calendar coating, electrodeposition coating, dip coating, or die coating; letterpress such as flexography; intaglio printing such as direct gravure printing or offset gravure printing; surface printing such as offset printing; or mimeograph such as screen printing. The application is preferably performed so that the applied material has the same shapes as the source electrode 25 and the drain electrode 26. If difficult, a resist is applied by the above-described process, and then an electrode pattern is formed by etching through the resulting resist film functioning as an etching mask. For plating, the precursor is applied and plated in a plating bath, followed by being washed, dried, and postbaked. An example of a process for forming the source electrode 25 and the drain electrode 26 by plating is omitted because this example is the same as that of the gate electrode 15.

Figure 7D:
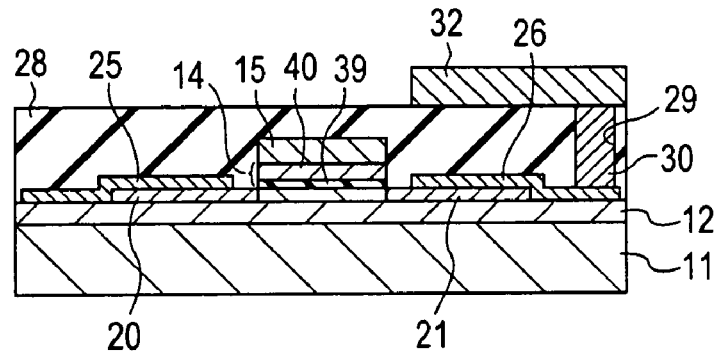

As shown in FIG. 7D, an interlayer insulating film 28 for passivation is formed on the entire surface. The surface of the interlayer insulating film 28 is planarized. Then, a predetermined portion of the interlayer insulating film 28 on the drain electrode 26 is removed by etching to form a via hole 29. An oxide film such as a silicon oxide film may be used as the interlayer insulating film 28. An oxide film formed by coating, similar to, for example, the oxide film 40, may be used as the above-described oxide film. The thickness of the oxide film formed by coating may be changed by adjusting the solvent content, as needed. In this case, the oxide film is preferably formed by printing so as to have the shape of a via hole 29. Then, the inside of the via hole 29 is filled with a metal such as tungsten (W) to form a contact plug 30. A transparent electrode 32 is formed on the interlayer insulating film 28 so as to connect to the contact plug 30. The transparent electrode 32 is connected to the drain electrode 26 via the contact plug 30.

For example, poly(3,4-ethylenedioxythiophene) doped with polystyrene sulfonic acid (PEDOT-PSS) may be used as the transparent electrode 32. Examples of a solvent used for coating include ethers such as diethyl ether, dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, 1,2-dimethoxyethane, and p-dioxane; and hydrocarbons such as n-pentane, n-hexane, n-heptane, n-octane, decane, dodecane, cyclohexane, cyclooctane, styrene, dicyclopentane, benzene, toluene, xylenes, cumene, durene, indene, tetrahydronaphthalene, decahydronaphthalene, and squalane; polar solvents such as propylene carbonate, γ-butyrolactone, N-methyl-2-pyrrolidone, dimethylformamide, acetonitrile, dimethyl sulfoxide, methylene chloride, and chloroform. These solvents may be used alone or in combination, if necessary. The amount of solvent used is adjusted as appropriate so that the transparent electrode 32 has a desired thickness. If necessary, a mixture containing metal nanoparticles dispersed in a solvent may be used. The metal nanoparticles are preferably composed of noble metals such as Au, Ag, Pt; or Ru. The metal nanoparticles may be composed of other metals such as Al, Cu, Ni, Zn, In, or Cr. The metal particles each have a particle size of 100 nm or less, and preferably 20 nm or less. An example will be described below. Silver (Ag) nanoparticles were dispersed in PEDOT-PSS and spin-coated at 1,000 rpm, followed by annealing at 150° C. for 1 hour in a nitrogen atmosphere, to produce a PEDOT-PSS film having a thickness of 250 nm. The resulting PEDOT-PSS film had a sheet resistance of 15Ω/□ and a transmittance of 80%.

In some displaying systems, a metal electrode can be used instead of the transparent electrode 32. The metal electrode can be formed by the same process as that of the gate electrode 15. Consequently, a target silicon TFT is produced.

According to a second embodiment, a silicon TFT can be easily produced by a low-temperature process such as application or plasma oxidation in an ambient pressure. This reduces the capital investment for the silicon TFT significantly, and thus the silicon TFT can be produced at low cost. Furthermore, when the substrate 11 is a flexible substrate composed of, for example, plastic, a display panel can be produced by a roll-to-roll process. This enables to produce, for example, a large-sized flat-screen liquid crystal display.

EXAMPLE 4

In Example 4, a display panel including silicon TFTs produced by a roll-to-roll process will be described below. FIGS. 9 to 16 show the production process.

Figure 9:
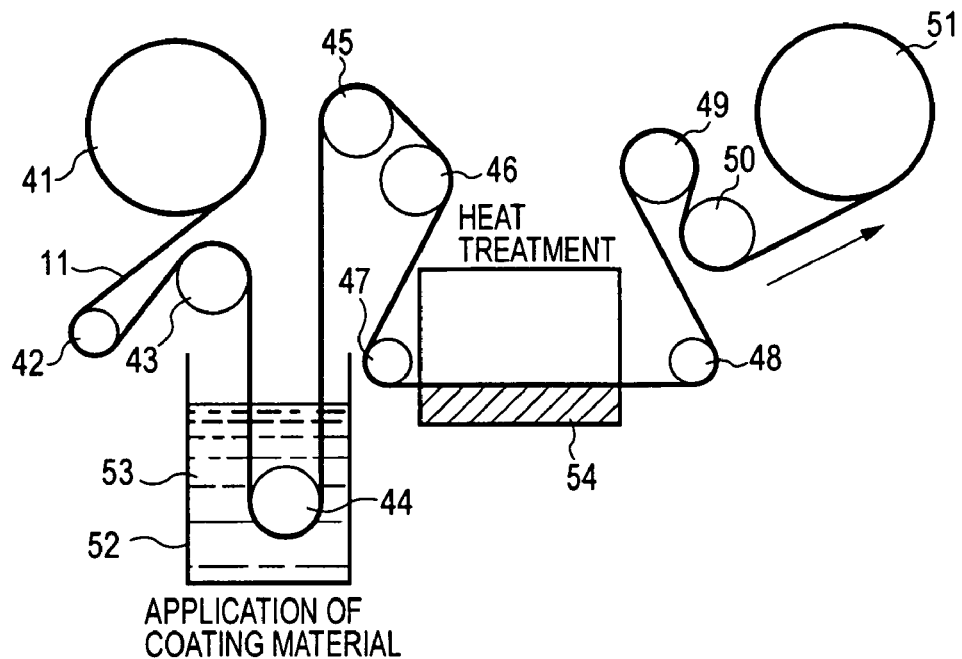
FIGS. 9 to 16 each are a schematic view illustrating a method for producing a display panel according to the second embodiment of the present invention.

As shown in FIG. 9, a substrate 11 wound around a roller 41 is fed from the roller 41 to a roller 51 via rollers 42 to 50 and passes through a material solution 53 containing a material for a buffer layer in a container 52 to apply the material solution 53 on the substrate 11. The resulting solution layer is annealed through a heating apparatus to form a buffer layer 12.

Figure 10:
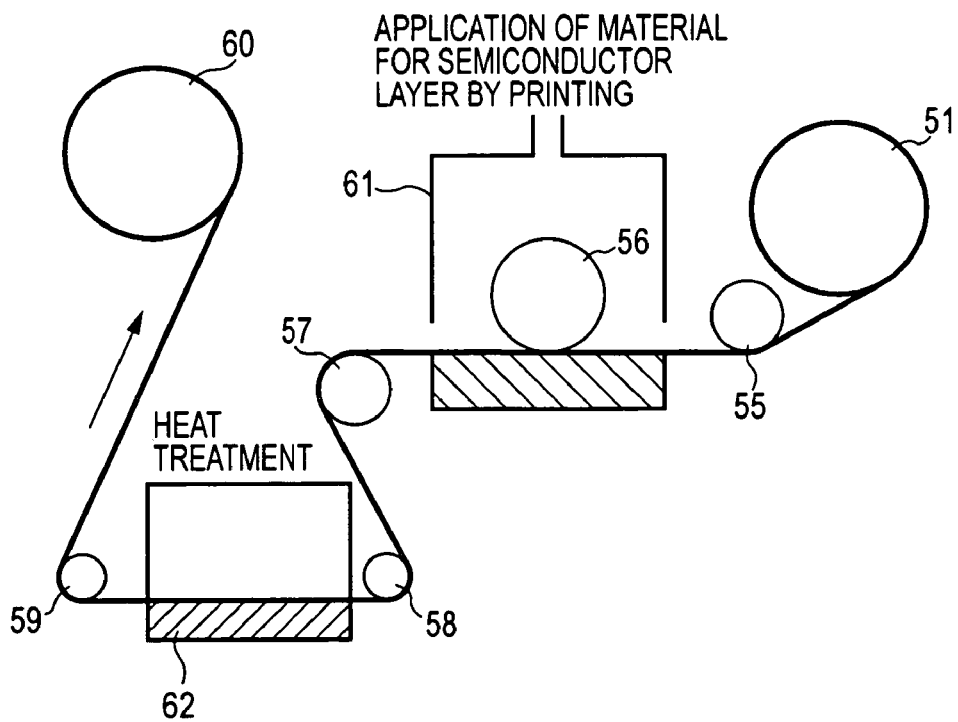

As shown in FIG. 10, the substrate 11 is fed from the roller 51 to a roller 60 via rollers 55 to 59. A polysilane compound is applied on the substrate 11 in a chamber 56 by printing and then annealed through a heating apparatus 62 to form a silicon film 13.

Figure 11:
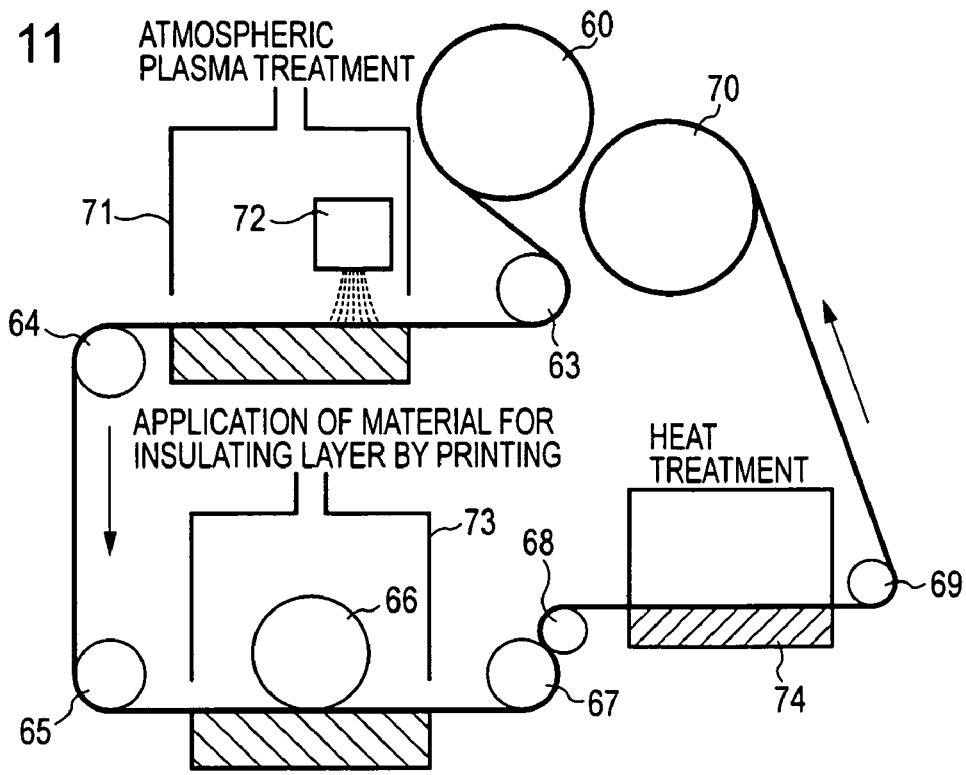

As shown in FIG. 11, the substrate 11 is fed from the roller 60 to a roller 70 via rollers 63 to 69. The surface of the silicon film 13 is subjected to atmospheric pressure plasma treatment in a chamber 71 with a plasma irradiation apparatus 72 to form an oxide film 39. A solution containing a material for an oxide film is applied on the oxide film 39 in a chamber 73 by printing and then annealed through a heating apparatus 74 to form an oxide film 40.

Figure 12:
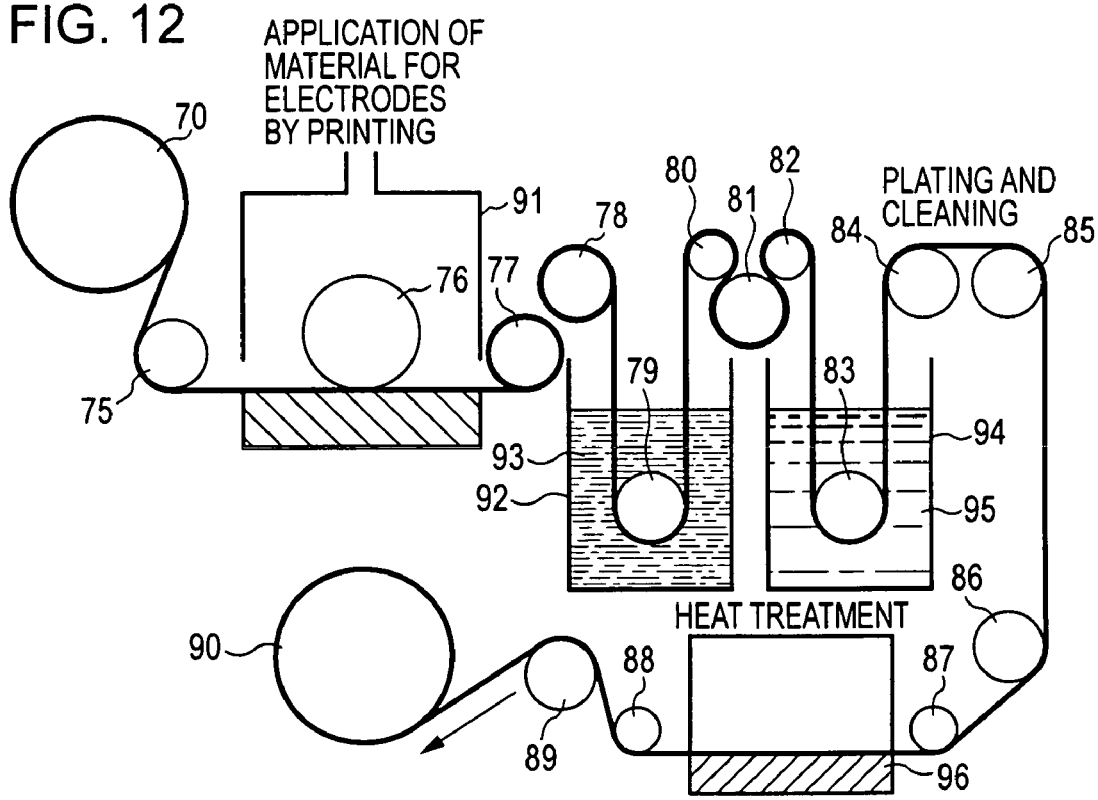

As shown in FIG. 12, the substrate 11 is fed from the roller 70 to a roller 90 via rollers 75 to 89. A solution containing a material for a gate electrode is applied on the oxide film 40 in a chamber 91 by printing and plated through a plating bath 93 in a container 92 and then washed through a cleaning fluid 95 in a container 94, followed by annealing through a heating apparatus 96 to form a gate electrode 15.

Figure 13:
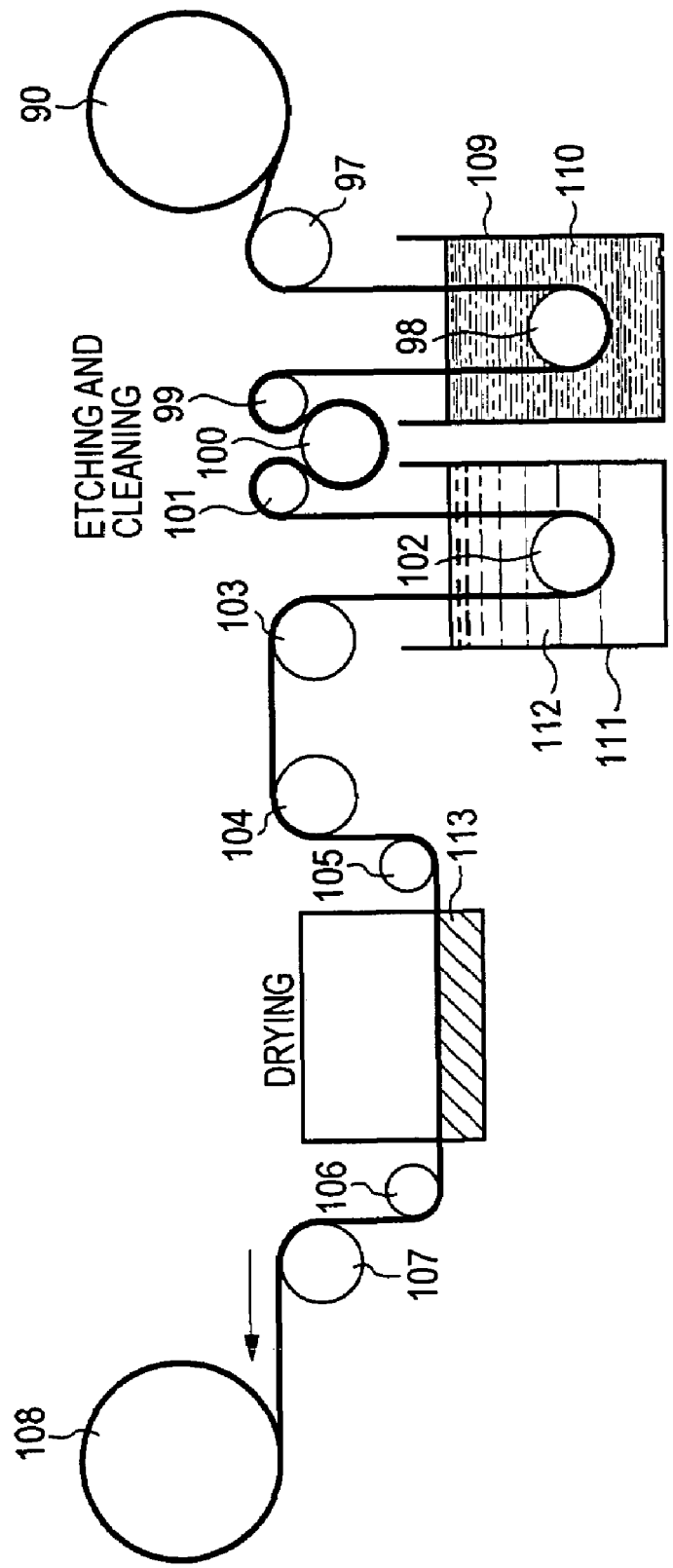

As shown in FIG. 13, the substrate 11 is fed from the roller 90 to a roller 108 via rollers 97 to 107, and then the oxide films 39 and 40 are etched through an etching fluid 110 in a container 109. Then, the substrate 11 is washed through a cleaning fluid 112 in a container 111 and then dried through a dryer 113.

Figure 14:
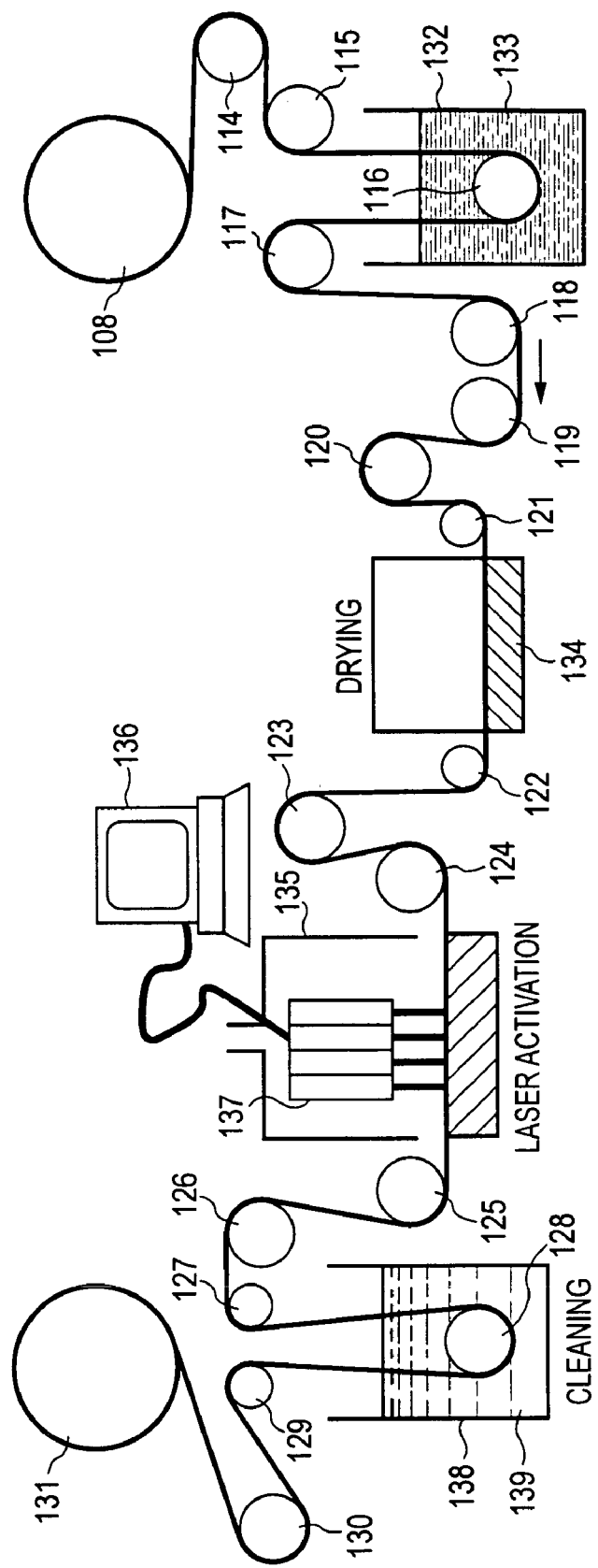

As shown in FIG. 14, the substrate 11 is fed from the roller 108 to a roller 131 via rollers 114 to 130 and passes through a solution 133 containing impurity ions in a container 132 to apply the solution on the substrate 11, followed by drying through a dryer 134. The substrate 11 is irradiated with a laser beam emitted from a laser 137, which is controlled with a computer 136, in a chamber 135, to diffuse impurities toward the silicon film 13 through the gate electrode 15 functioning as a mask, thus producing a source region 20 and a drain region 21. Subsequently, the substrate 11 is washed through a cleaning fluid 139 in a container 138.

Figure 15:
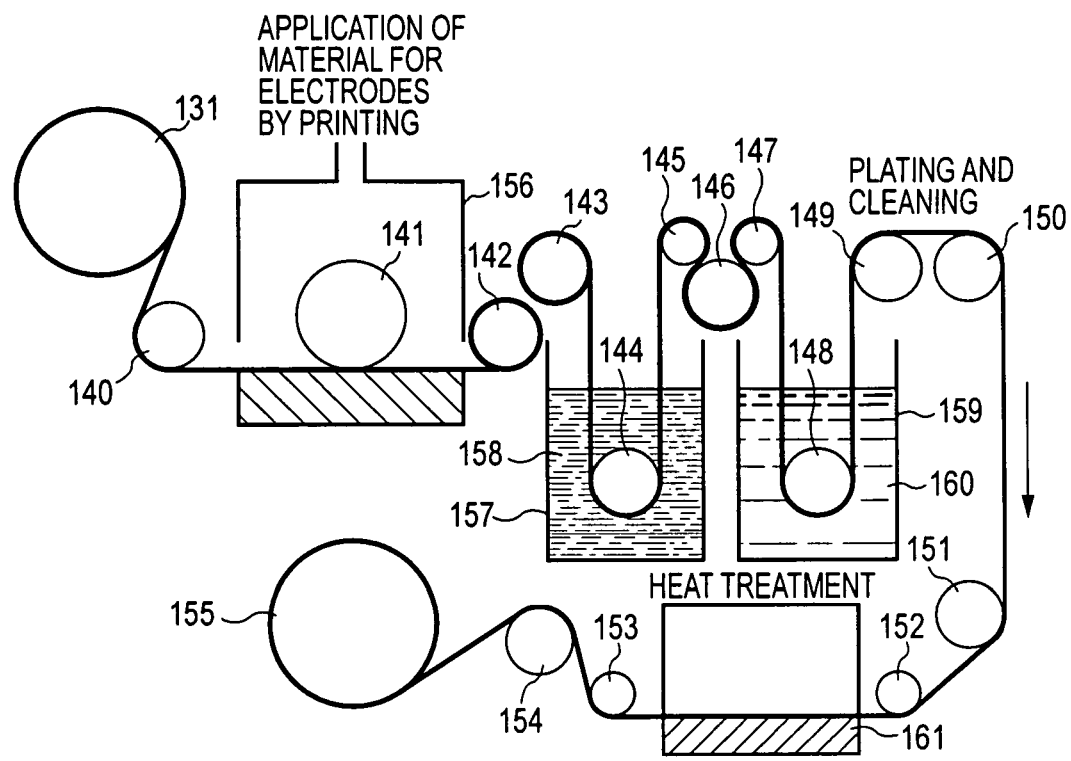

As shown in FIG. 15, the substrate 11 is fed from the roller 131 to a roller 155 via rollers 140 to 154. A solution containing a material for a source electrode and a drain electrode is applied on the source region 20 and the drain region 21 in a chamber 156 by printing and plated through a plating bath 158 in a container 157 and then washed through a cleaning fluid 160 in a container 159, followed by annealing through a heating apparatus 161 to form a source electrode 25 and a drain electrode 26.

Figure 16:
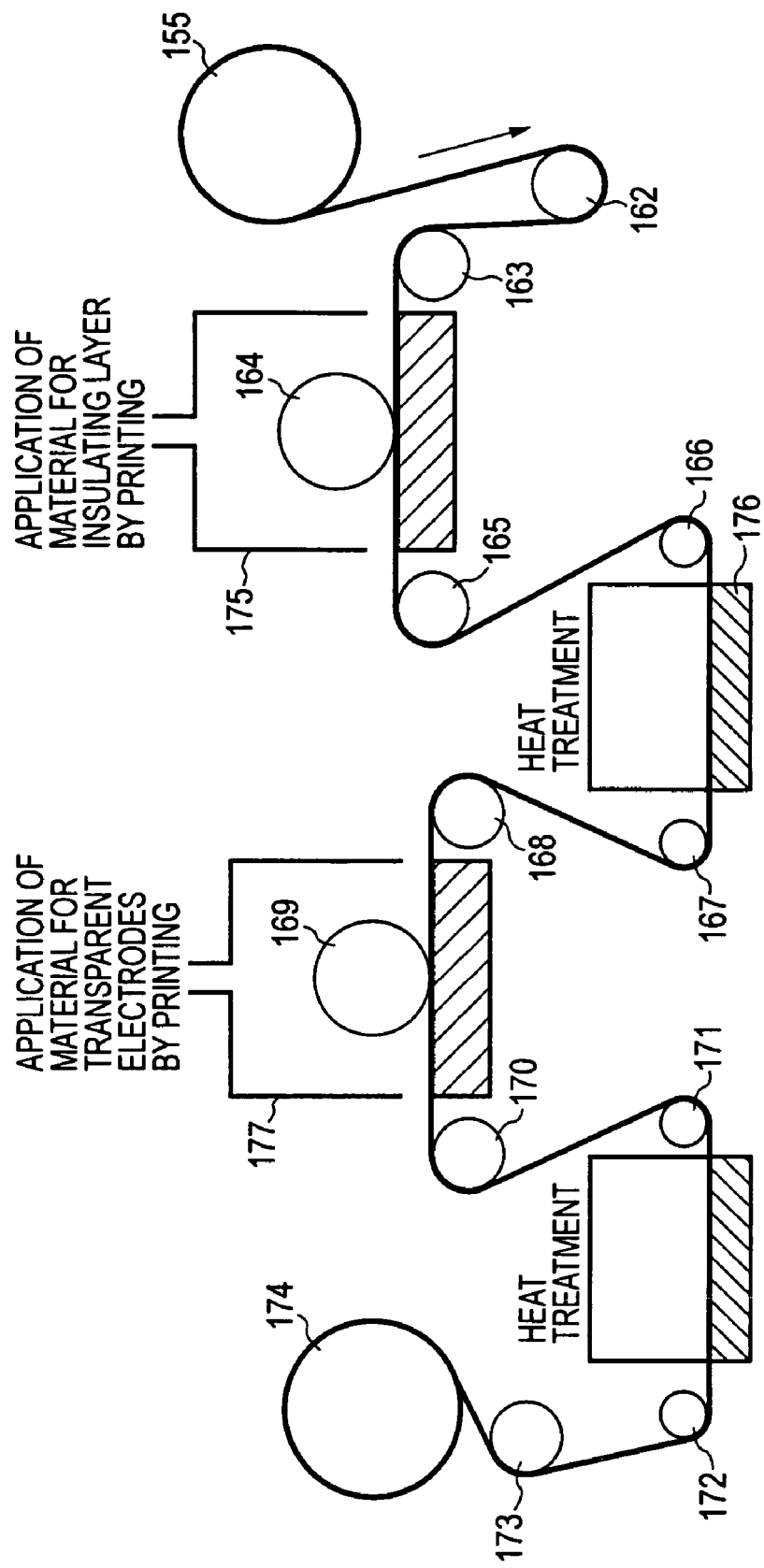

As shown in FIG. 16, the substrate 11 is fed from the roller 155 to a roller 174 via rollers 162 to 173. A solution containing a material for oxide film is applied in a chamber 175 and annealed through a heating apparatus 176 to form an interlayer insulating film 28. A solution containing a material for a transparent electrode is applied on the interlayer insulating film 28 in a chamber 177 by printing and then annealed through a heating apparatus 178 to form a transparent electrode 32.

While the present invention has been described with reference to embodiments and examples, it is to be understood that the present invention is not limited to the disclosed embodiments and examples. On the contrary, the invention is intended to cover various modifications and equivalent arrangements included within the spirit and scope of the technical idea of the present invention. For example, structures, shapes, materials, and processes, which are shown in the above-described embodiments and examples, are merely examples. Any other structures, shapes, materials, and processes may be used, if necessary.

What is claimed is:

1. A method for doping impurities, comprising the steps of:
    applying a solution containing impurity ions onto at least part of a surface of a base including a gate electrode;
    drying the solution to form a compound layer containing the impurities onto the at least part of the surface of the base and directly onto an uncoated surface of the gate electrode;
    diffusing the impurity ions in the compound layer toward the base by a heat treatment, wherein the gate electrode functions as a mask; and
    removing the compound layer.

2. The method according to claim 1, wherein the solution is applied by coating, spraying, or printing.

3. The method according to claim 1, wherein the base comprises a semiconductor.

4. The method according to claim 1, wherein the impurity ions are ions of an element in group V or group III of the periodic table, and the base comprises an element in group IV of the periodic table.

5. The method according to claim 1, wherein the heat treatment is performed with an energy source.

6. The method according to claim 5, wherein the energy source is selected from the group consisting of a laser beam, an electron beam, infrared rays emitted from an infrared lamp, and ultraviolet rays emitted from an ultraviolet lamp.

7. The method according to claim 5, wherein the energy source is a laser beam, and the surface of the base is heated by selectively irradiating with the laser beam.

8. The method according to claim 1, wherein the base comprises a semiconductor film on an amorphous substrate, the semiconductor film comprising a deposited polysilane compound, a deposited polycondensate of a polysilane compound, amorphous silicon, microcrystalline silicon, polysilicon, or monocrystalline silicon.

9. The method according to claim 1, wherein at least one of the steps is performed by a roll-to-roll process.

10. The method according to claim 1, wherein all the steps are performed by a roll-to-roll process.

11. A method for producing a semiconductor device, comprising the steps of:
- applying a solution containing impurity ions onto at least part of a surface of a semiconductor base including a gate electrode;
- drying the solution to form a compound layer containing the impurities onto the at least part of the surface of the semiconductor base and directly onto an uncoated surface of the gate electrode;
- diffusing the impurity ions in the compound layer toward the semiconductor base by a heat treatment, wherein the gate electrode functions as a mask; and
- removing the compound layer.

12. The method according to claim 11, further comprising the steps of:
- forming a gate insulating film and forming the gate electrode.

13. The method according to claim 12, wherein the gate insulating film comprises a silanol compound or a corresponding polycondensate.

14. The method according to claim 12, wherein the gate electrode comprises a film formed by plating or a film formed by coating a metal material.

15. A method for producing a semiconductor device, comprising the steps of:
- forming an amorphous silicon film on a substrate;
- irradiating the amorphous silicon film with an energy source to modify the amorphous silicon film into a crystalline silicon film;
- forming a gate insulating film on the crystalline silicon film;
- forming a gate electrode on the gate insulating film;
- applying a solution containing impurity ions onto the crystalline silicon film at both sides of the gate electrode;
- drying the solution to form a compound layer containing the impurities;
- diffusing the impurity ions in the compound layer toward the crystalline silicon film by a heat treatment, wherein the gate electrode functions as a mask, to form a source region and a drain region; and
- removing the compound layer.

16. A method for producing an applied electronic apparatus, comprising the steps of:
- allowing a solution containing impurity ions onto at least part of a surface of a semiconductor base including a gate electrode;
- drying the solution to form a compound layer containing the impurities onto the at least part of the surface of the semiconductor base and directly onto an uncoated surface of the gate electrode;
- diffusing the impurity ions in the compound layer toward the semiconductor base by a heat treatment, wherein the gate electrode functions as a mask; and
- removing the compound layer.

17. A method for producing an applied electronic apparatus, comprising the steps of:
- forming an amorphous silicon film on a substrate;
- irradiating the amorphous silicon film with an energy source to modify the amorphous silicon film into a crystalline silicon film;
- forming a gate insulating film on the crystalline silicon film;
- forming a gate electrode on the gate insulating film;
- applying a solution containing impurity ions onto the crystalline silicon film at both sides of the gate electrode;
- drying the solution to form a compound layer containing the impurities;
- diffusing the impurity ions in the compound layer toward the crystalline silicon film by a heat treatment, wherein the gate electrode functions as a mask, to form a source region and a drain region; and
- removing the compound layer.

* * * * *